(12) United States Patent
Chakrabarti

(10) Patent No.: US 7,092,981 B2
(45) Date of Patent: Aug. 15, 2006

(54) NON-RECIPROCAL NETWORK ELEMENT THAT PRODUCES AN INPUT IMPEDANCE THAT IS A FUNCTION OF THE MULTIPLICATION-DIVISION OF ITS LOAD IMPEDANCES

(75) Inventor: Satyabrata Chakrabarti, Aurora, IL (US)

(73) Assignee: Lucent Technologies Inc., Murray Hill, NJ (US)

( * ) Notice: Subject to any disclaimer, the term of this patent is extended or adjusted under 35 U.S.C. 154(b) by 735 days.

(21) Appl. No.: 10/260,088

(22) Filed: Sep. 27, 2002

(65) Prior Publication Data

US 2004/0073595 A1    Apr. 15, 2004

(51) Int. Cl.
*G06G 7/16*   (2006.01)

(52) U.S. Cl. ..................................... 708/835

(58) Field of Classification Search ................. 708/835
See application file for complete search history.

(56) References Cited

U.S. PATENT DOCUMENTS

| 3,612,780 | A | * | 10/1971 | Beurrier et al. | ............. 333/109 |
| 3,644,851 | A | * | 2/1972 | Daniels | ...................... 333/215 |
| 5,903,198 | A | * | 5/1999 | Weiss | ........................ 333/24.1 |
| 2004/0138866 | A1 | * | 7/2004 | Harjung | ...................... 703/14 |

* cited by examiner

*Primary Examiner*—Tan V. Mai

(57) ABSTRACT

The Impedance Multiplication-Division Operators are made up of non-reciprocal network elements, each of which produces an input impedance that is related to the multiplication-division of its load impedances. The Impedance Multiplication-Division Operator can be implemented in a number of embodiments, such as the Positive Impedance Multiplication-Division Operator which produces a new non-reciprocal (n+1)-port, $n \geq 4$, network element which has the distinguishing property that if three 2-terminal impedances, $Z_2(s)$, $Z_3(s)$, and $Z_4(s)$ are connected at ports 2, 3 and 4 of a $_1PIMDOR_{2,4}^3$, the input impedance offered by this loaded 4-port at port 1 is $Z_{(1)}(s) = Z_2^{-1}(s)Z_3(s)Z_4^{-1}(s)$.

14 Claims, 21 Drawing Sheets

$\zeta = \sqrt{Z_2 Z_4}$ $\zeta = \sqrt{Z_2 Z_4}$

US 7,092,981 B2

NON-RECIPROCAL NETWORK ELEMENT THAT PRODUCES AN INPUT IMPEDANCE THAT IS A FUNCTION OF THE MULTIPLICATION-DIVISION OF ITS LOAD IMPEDANCES

CROSS-REFERENCE TO RELATED APPLICATIONS

This application is related to an application titled "Non-Reciprocal Network Element That Produces An Input Impedance That Is A Product Of Its Load Impedances", filed on Sep. 27, 2002, Ser. No. 10/260,873.

FIELD OF THE INVENTION

This invention relates to multi-port network elements that have a determinable and controllable impedance at their input port, which input impedance is a product of the load impedances.

PROBLEM

It is a problem in the field of linear electrical networks to synthesize a network element which presents an impedance that represents the multiplication or division of two arbitrary real rational functions.

The synthesis of linear electrical networks in the frequency domain is a mature, well-understood discipline. Both passive and active elements are used to synthesize networks, with filters and various generalized immittance transformers being among the major applications of this technology. A modern analog circuit designer is almost always asked to synthesize circuits that admit implementation as an IC chip or part of a VLSI layout using only resistors, capacitors and transistors as the building blocks. Synthesis of arbitrary real rational functions of the complex frequency variable 's' in the form of $$\frac{N(s)}{D(s)}$$

as a driving-point impedance function, where N(s) and D(s) are both polynomials with rational coefficients, is one of the fundamental problems of network synthesis. A vast number of solution techniques exist, all requiring generally complex manipulation of rational functions. The toolkit of analog circuit designers includes well-known network elements such as current conveyors, gyrators, various negative immittance converters and inverters, different types of controlled sources, etc., all of which admit direct IC implementations. These elements, together with resistors and capacitors, constitute the foundation of analog circuit design. However, even with these capabilities, the synthesis of a network element which presents an impedance that represents the multiplication or division of two arbitrary real rational functions remains a difficult problem to solve.

SOLUTION

The above described problems are solved and a technical advance achieved by the present non-reciprocal network element that produces an input impedance that is related to the multiplication-division of its load impedances, termed "Impedance Multiplication-Division Operator" herein.

The Impedance Multiplication-Division Operator can be implemented in a number of embodiments, such as the Positive Impedance Multiplication-Division Operator which produces a new non-reciprocal (n+1)-port, $n \geq 4$, network element which has the distinguishing property that if three 2-terminal impedances, $Z_2(s)$, $Z_3(s)$, and $Z_4(s)$ are connected at ports 2, 3 and 4 of a $_1\text{PIMDOR}_{2,4}{}^3$, the input impedance offered by this loaded 4-port at port 1 is $Z_{(1)}(s) = Z_2^{-1}(s) Z_3(s) Z_4^{-1}(s)$. As a single network element, Positive Impedance Multiplication-Division Operator thus offers a direct and completely general mechanism for multiplication and division of 2-terminal impedance functions. The availability of such an element obviously adds significant flexibility in solving the general synthesis problems for immittance functions. For example, by setting $Z_3(s) \equiv 1\Omega$, $Z_{(1)}(s) = Z_2^{-1}(s) Z_4^{-1}(s)$ is obtained, i.e., a pure reciprocal of the product of two impedance functions.

Another embodiment of the Impedance Multiplication-Division Operator is an active non-reciprocal 2(n+1)-port, $n \geq 2$, network element called General Positive Impedance Multiplication-Division Operator which has one input port and 2n+1 output ports, one of which is a distinguished output port. The defining property of this element is that if 2(n+1) 2-terminal impedances, $Z_2, Z_3, \ldots, Z_{2n+1}$, and $Z_L$ are connected at ports $2, 3, \ldots, 2n$, and the distinguished output port L of a General Positive Impedance Multiplication-Division Operator respectively, the input impedance offered by this loaded multi-port at port 1 can be of one the two forms:

$$Z_{(1)} = Z_L \prod_{k=2}^{2n+1} Z_k^{-1}, \text{ or } Z_{(1)} = Z_L \prod_i Z_i \times \prod_j Z_j^{-1},$$

with the constraints on i and j as explained below. As a single network element, General Positive Impedance Multiplication-Division Operator thus offers a direct yet general mechanism for multiplication and division of 2-terminal impedance functions. This network element allows simpler and more direct synthesis of driving point impedance functions and should be especially useful for analog RF and microwave applications. For example, by setting $Z_L$ and certain $Z_i$'s to $1\Omega$, we immediately obtain $$Z_{(1)} = \prod_j Z_j^{-1},$$

i.e., a pure reciprocal of the product of an arbitrary finite number of impedance functions.

The implementations disclosed herein also include a Negative Impedance Multiplication-Division Operator version of the Positive Impedance Multiplication-Division Operator and a generalized Negative Impedance Multiplication-Division Operator version of the generalized Positive Impedance Multiplication-Division Operator.

DETAILED DESCRIPTION OF THE DRAWINGS

The present non-reciprocal network element produces an input impedance that is related to the multiplication-division of its load impedances, termed "Impedance Multiplication-Division Operator" herein.

Positive Impedance Multiplication-Division Operator

Figure 1:
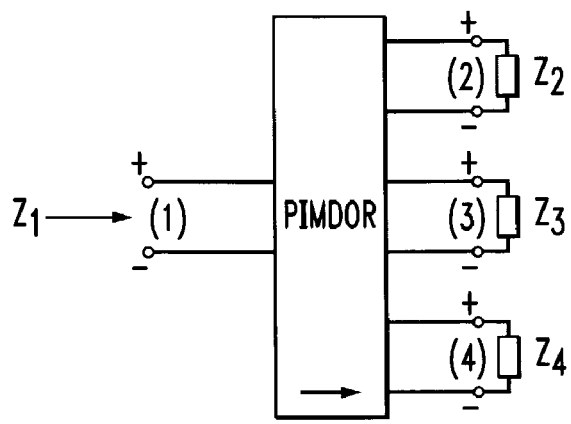
FIG. 1 illustrates in block diagram form a representation of a Positive Impedance Multiplication-Division Operator network element.

FIG. 1 illustrates a non-reciprocal 3-port network element called a Positive Impedance Product Operator (PIMDOR) which has the distinguishing property that if three 2-terminal impedances, $Z_2(s)$, $Z_3(s)$, and $Z_4(s)$ are connected at ports 2, 3 and 4 of a $_1\text{PIMDOR}_{2,4}^3$, the input impedance offered by this loaded 4-port at port 1 is $Z_{(1)}(s)=Z_2^{-1}(s)Z_3(s)Z_4^{-1}(s)$.

The following hybrid matrix conveniently expresses the relationship among the voltage- and current-variables at the ports of a $_1\text{PIMDOR}_{2,4}^3$.

$$\begin{bmatrix} V_1 \\ V_2 \\ I_3 \\ V_4 \end{bmatrix} = \begin{bmatrix} 0 & -1 & 0 & 0 \\ 0 & 0 & 1 & 0 \\ 0 & 0 & 0 & -1 \\ 1 & 0 & 0 & 0 \end{bmatrix} \begin{bmatrix} I_1 \\ I_2 \\ V_3 \\ I_4 \end{bmatrix}, \quad (1)$$

where $V_j$ and $I_j$ denote the voltage- and current-variables at the j th port, j=1, 2, 3, 4, respectively.

Controlled Source Representation

Figure 2:
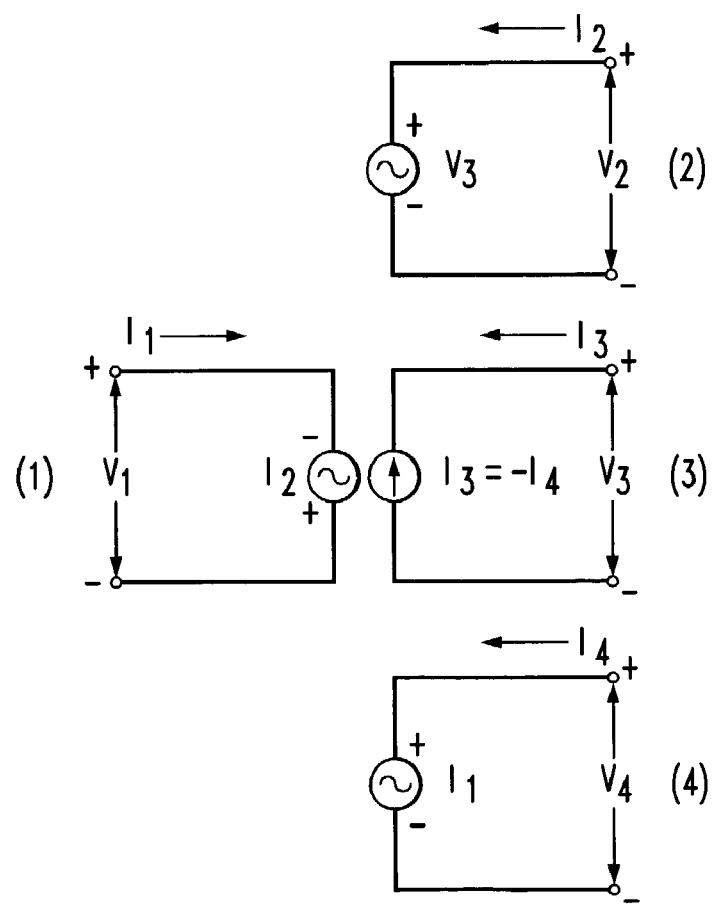
FIG. 2 illustrates a controlled source representation of the Positive Impedance Multiplication-Division Operator network element of FIG. 1.

The hybrid matrix of Equation (1) immediately yields the controlled source representation of FIG. 2. Referring back to FIG. 1, assume that the 2-terminal impedances, $Z_2$, $Z_3$, and $Z_4$, are connected as loads at ports 2, 3, and 4 of the circuit of FIG. 2, respectively. Since all port currents are shown to be flowing inside:

$$V_1 = -I_2 = -\frac{V_2}{Z_2} = -\frac{V_3}{Z_2} = -\frac{I_3 Z_3}{Z_2} = -\frac{(-I_4)Z_3}{Z_2} = \frac{V_4}{Z_4} \times \frac{Z_3}{Z_2} = \frac{I_1}{Z_4} \frac{Z_3}{Z_2}.$$

Hence, the input impedance seen at port 1, $Z_{(1)}$, is given by:

$$Z_{(1)} = \frac{V_1}{I_1} = Z_2^{-1} Z_3 Z_4^{-1}. \quad (2)$$

The configuration of FIG. 2 is therefore the controlled-source equivalent representation of a Positive Impedance Multiplication-Division Operator.

Figure 3:
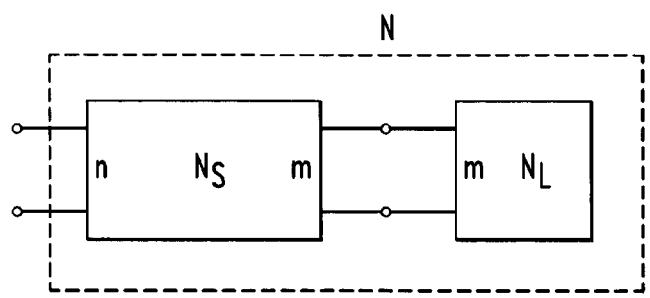
FIG. 3 illustrates the interconnection of an (n+m)-port network element with an n-port network element.

FIG. 3 illustrates a well-studied configuration of an (n+m)-port network $N_S$, loaded by an m-port network $N_L$. Let $Z_S$, $Z_L$, and Z denote the multi-port impedance matrices of $N_S$, $N_L$, and the resultant n-port N shown within the dotted box in FIG. 3. Consider the partitioned representation of $Z_S$ shown in Equation (3):

$$Z_S = \begin{bmatrix} Z_{11} & Z_{12} \\ \hline Z_{21} & Z_{22} \end{bmatrix}_m^n ; \quad (3)$$

the number of rows and columns for the partitioned sub-matrices are shown on the right and the bottom, respectively. The multi-port impedance matrix of N is then given by:

$$Z = Z_{11} - Z_{12}(Z_{22}+Z_L)^{-1}Z_{21}. \quad (4)$$

From Equation (4), for $Z_{11}=Z_{22}=0$, Equation (4) reduces to:

$$Z = -Z_{12}Z_L^{-1}Z_{21}. \quad (5)$$

A multi-port described by a Z-matrix with $Z_{11}=Z_{22}=0$ corresponds to an impedance inverter type configuration. The positive impedance inverters are more commonly known as gyrators; for such multi-ports, $Z_{12}$ and $Z_{21}$ are of opposite signs; conversely, for the negative impedance inverter (Negative Impedance Inverter) type multi-ports, $Z_{12}$ and $Z_{21}$ are of the same negative sign.

Figure 4:
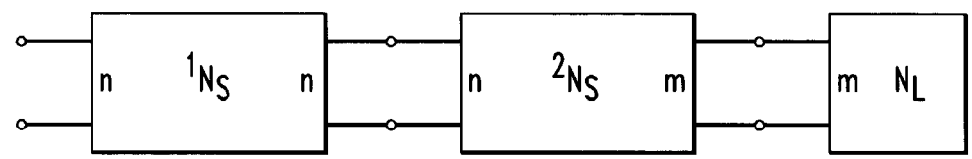
FIG. 4 illustrates the circuit of FIG. 3 where the load impedance $N_L$ is replaced by a "topological copy" of FIG. 3.

Now consider FIG. 4, where the load m-port network $N_L$ is replaced by a "topological copy" of FIG. 3. The distinct forward superscripts in FIG. 4 are used to denote the distinct parameters of the sub-networks in the diagram; observe that to ensure consistency of the voltage-current equations, the number of output ports of $^1N_S$ is now also n, the same as the number of input ports of $^2N_S$. From Equation (5):

$$Z = -^1Z_{12}(-^2Z_{12} \times Z_L^{-1} \times ^2Z_{21})^{-1} \, ^1Z_{21} . \quad (6)$$
$$= {}^1Z_{12} \times {}^2Z_{21}^{-1} \times Z_L \times {}^2Z_{12}^{-1} \times {}^1Z_{21}$$

Let $I_n$ denote the n×n identity matrix. Setting $^1Z_{12}=^1Z_{21}=I_n$ in (6), then.

$$Z = {}^2Z_{12}^{-1} \times Z_L \times {}^2Z_{12}^{-1}. \quad (7)$$

Equation (7) has the desired form of Equation (2) whenever both $^1N_S$ and $^2N_S$ are either gyrator-type or Negative Impedance Inverter-type multi-ports.

Figure 5:
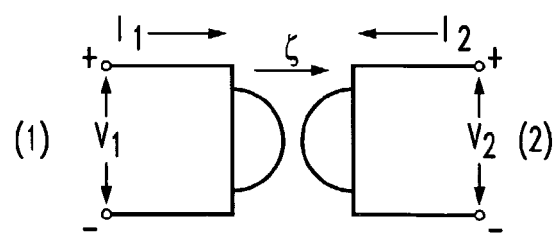
FIG. 5 illustrates the symbol for a gyrator.

The analysis of the general multi-ports is now specialized to 2-ports. FIG. 5 shows the standard representation of a 2-port gyrator, characterized by the impedance matrix of one of the following two forms:

$$\begin{bmatrix} 0 & -Z_2 \\ Z_4 & 0 \end{bmatrix}, \text{ or } \begin{bmatrix} 0 & Z_2 \\ -Z_4 & 0 \end{bmatrix}, \zeta = \sqrt{Z_2Z_4} ,$$

Figure 6:
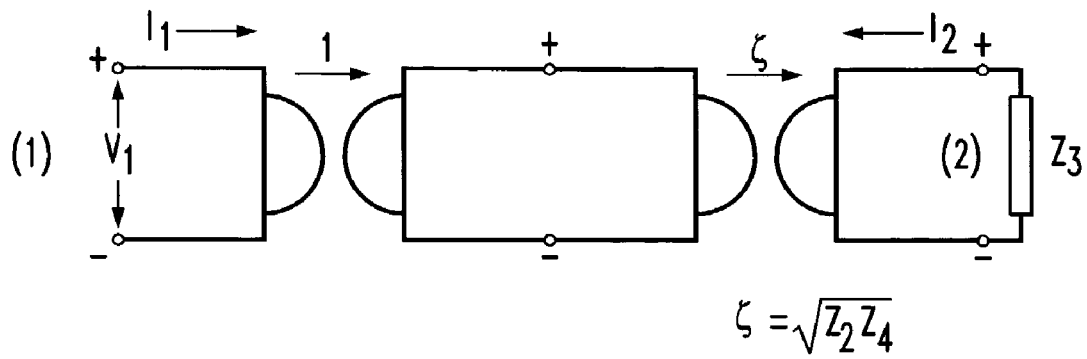
FIG. 6 illustrates the circuit derived from FIG. 4 using gyrators.

FIG. 6 shows the counterpart of FIG. 4 where $^1N_S$ and $^2N_S$ of FIG. 4 are replaced with 2-port gyrators with appropriate parameter values, and the gyrator corresponding to $^2N_S$ is loaded with the 2-terminal impedance $Z_3$ at its own port 2. Then, from Equation (5), the driving point impedance at port 1 of FIG. 6 is:

$$Z_{(1)} = Z_2^{-1}Z_4^{-1}Z_3 = Z_2^{-1}Z_3Z_4^{-1}, \quad (8)$$

which is the desired form as in Equation (2).

Figure 7:
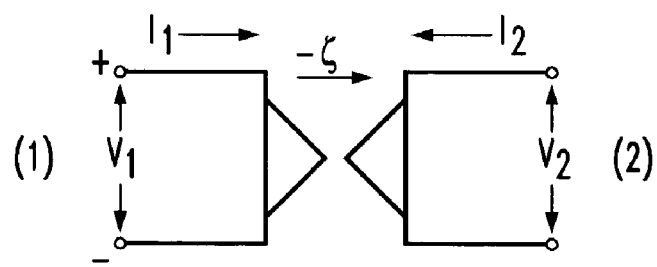
FIG. 7 illustrates the conventional circuit symbols that are used to represent a negative impedance inverter.
Figure 8:
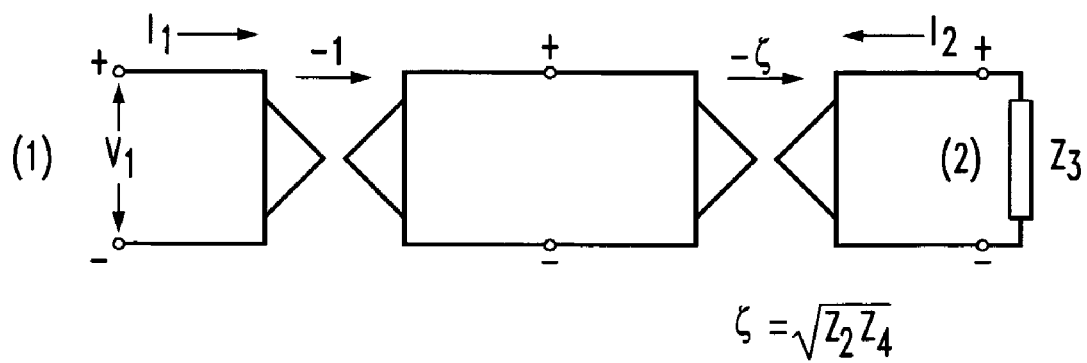
FIG. 8 illustrates the circuit derived from FIG. 4 using negative impedance inverters.

The same driving-point impedance can be obtained using two Negative Impedance Inverters of FIG. 7, instead of two gyrators. Recalling that the impedance matrix of a Negative Impedance Inverter-type 2-port is of the following form:

$$\begin{bmatrix} 0 & -Z_2 \\ -Z_4 & 0 \end{bmatrix}, \zeta = \sqrt{Z_2Z_4} ,$$

and using FIG. 8 as the Negative Impedance Inverter-counterpart of FIG. 6, the driving-point impedance function at port 1 of FIG. 8 is immediately as that shown in Equation (8).

Figure 9:
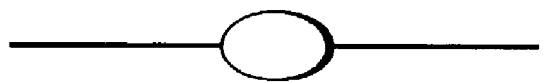
FIG. 9 illustrates the conventional circuit symbols for a nullator.
Figure 10:
FIG. 10 illustrates the conventional circuit symbols for a norator.

However, the resultant circuit is not a 4-port in FIG. 6 or FIG. 8. Conventional circuit theory does not allow us access inside a gyrator or a Negative Impedance Inverter and two of the so-called pathological circuit elements, called nullator and norator, must be used for this purpose. A nullator, conventionally represented as in FIG. 9, is a 2-terminal element with the voltage-current relationship described by v=i=0. The norator is characterized by the fact that its terminal variables v and i are completely arbitrary. The conventional symbol of a norator is shown in FIG. 10.

Figure 11:
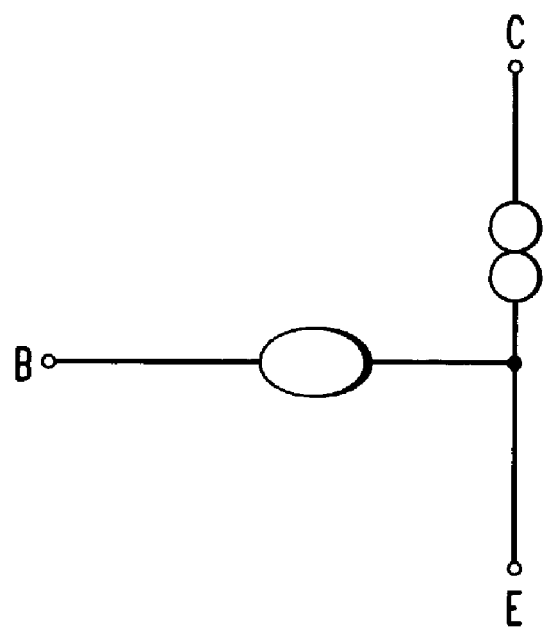
FIG. 11 illustrates an equivalence between a suitably connected nullator-norator pair and an ideal bipolar transistor.

FIG. 11 shows the equivalence between a norator-nullator pair and an ideal bipolar junction transistor, where the emitter E, base B, and collector C terminals of the equivalent ideal transistor are identified in the 3-terminal norator-nullator model. An ideal transistor is equally unrealizable in practice as a norator or a nullator. However, every algebraic characteristic (i.e., the form of its system functions including the sign of the coefficients, form of the system matrices, etc.) derived from a network containing norators and nullators corresponding to an equivalent transistorized network, is completely and consistently preserved even if the ideal transistors are replaced by physically realizable non-ideal transistors operating in the linear régime. These are the most common assumption for transistors in IC designs, regardless of the frequency range. Researchers have realized from the beginning that the passage from the norator-nullator representations to the equivalent transistor-resistor realizations is seldom straightforward in practice because of the difficulties in ensuring suitable DC biasing. The biasing issues are even more daunting for complex multi-port realizations with multiple transistors, which frequently require the use of floating power supplies and various voltage and current isolation mechanisms.

The equivalence between an idealized transistor and a norator-nullator pair came via the notion of yet another idealized pathological network element called nullor, where the norator-nullator pair really represents the nullor. A nullor is a universal active element in the sense that any active element can be represented using only nullors and passive components. The "universality" of nullors, and consequently its equivalent norator-nullator representation led to the recognition of another universal active element called a second generation current conveyor (CCII) from its equivalence with the nullor.

Figure 12:
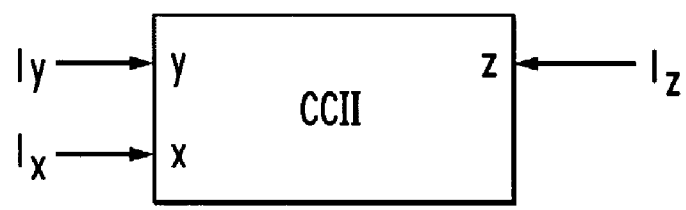
FIG. 12 illustrates the conventional circuit symbol for a second generation current conveyor.
Figure 13:
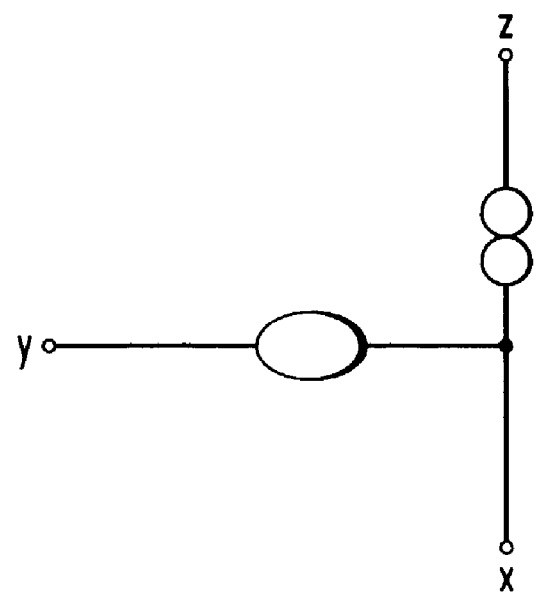
FIG. 13 illustrates the equivalence between a suitably connected nullator-norator pair and an ideal second generation current conveyor.

The ideal CCII, shown in FIG. 12, is a three-port device with the hybrid matrix voltage-current relationship given by:

$$\begin{bmatrix} V_x \\ I_y \\ I_z \end{bmatrix} = \begin{bmatrix} 0 & 1 & 0 \\ 0 & 0 & 0 \\ \pm 1 & 0 & 0 \end{bmatrix} \begin{bmatrix} I_x \\ V_y \\ V_z \end{bmatrix}$$

where the ± sign in the above equation is used to denote whether the current conveyor is designed to operate with a positive or negative unity gain, respectively designated as CCII+ and CCII−. Following the usual custom, a current conveyor is a 3-terminal device, similar to that for transistors, where the terminal voltages and currents are with respect to a specific reference terminal (usually the ground) external to the circuit element. FIG. 12 corresponds more to a 3-terminal representation than a 3-port representation. The corresponding norator-nullator equivalent model for a CCII is shown in FIG. 13. Observe that the same norator-nullator equivalent model is used to represent both a CCII+ and a CCII−, just as in the case of the norator-nullator equivalent model for a bipolar transistor, p-n-p or n-p-n, which is a consequence of the defining properties of these pathological network elements. Represented topologically, the equivalence between a norator-nullator pair on one hand and the transistors and CCII's on the other is identical. Extensive literature exists on the statndardized IC implementations of both types of CCII's that can directly replace their idealized representations over a wide variety of voltage-current-frequency regimes, including high microwave regions.

Figure 14:
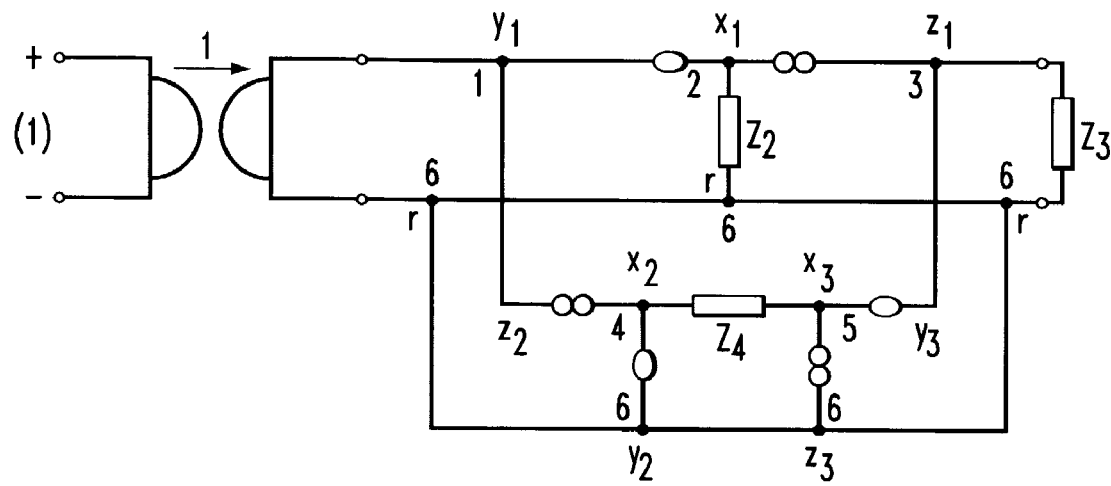
FIG. 14 illustrates a nullator-norator equivalent model of the circuit of FIG. 6.
Figure 15:
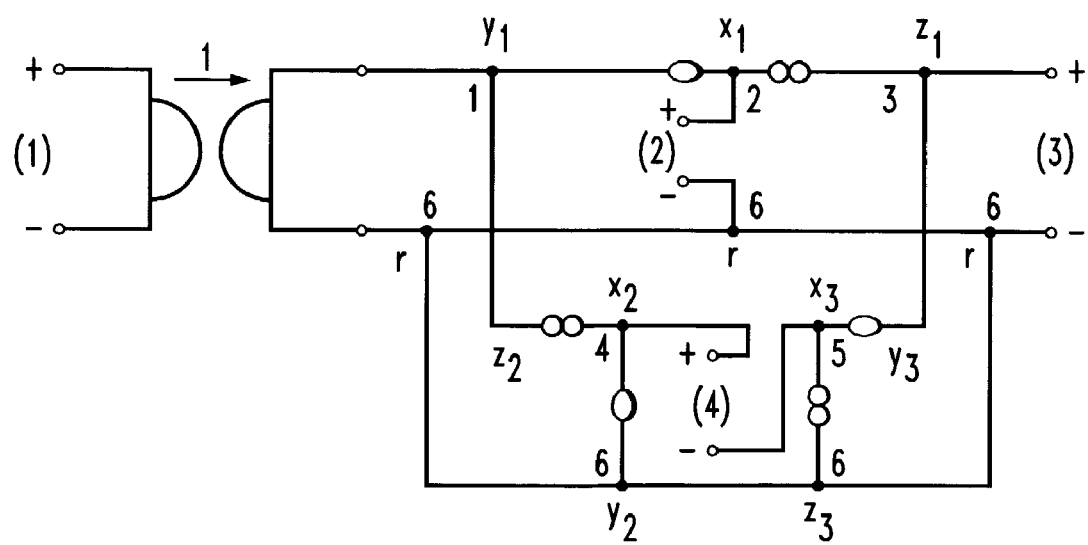
FIG. 15 illustrates a nullator-norator equivalent model of a Positive Impedance Multiplication-Division Operator network element that is derived from the circuit of FIG. 14.

Gyrators and Transistor-Resistor Realizations of Positive Impedance Multiplication-Division Operator Gyrators with a constant ζ are standard devices with many different discrete and IC implementations for applications ranging from low-frequency to high microwave ranges. In principle, all gyrators appear as a back-to-back connection of an inverting amplifier with a non-inverting amplifier in parallel. A typical model corresponding to a 3-transistor implementation is chosen for its elegant T-π configuration, which is one of the most basic for analog circuit design. FIG. 14 shows the implementation of FIG. 6 using this equivalent norator-nullator model. Observe that the standard gyrator with the unity conversion parameter remains untouched. The rest of the synthesis for Positive Impedance Multiplication-Division Operator is straightforward. As soon as the branches marked $Z_2$, $Z_3$, and $Z_4$ in FIG. 14 are removed, i.e., replaced with open circuits, the 4-port configuration of FIG. 15 is obtained. Conversely, it follows trivially that if the impedances $Z_2$, $Z_3$, and $Z_4$ are reconnected at ports 2, 3, and 4 respectively, the network of FIG. 15 reverts back to the loaded gyrator configuration of FIG. 14 with the impedance seen at port 1 as $Z_{(1)} = Z_2^{-1} Z_3 Z_4^{-1}$. FIG. 15 is therefore the desired norator-nullator equivalent model of a Positive Impedance Multiplication-Division Operator.

Figure 16:
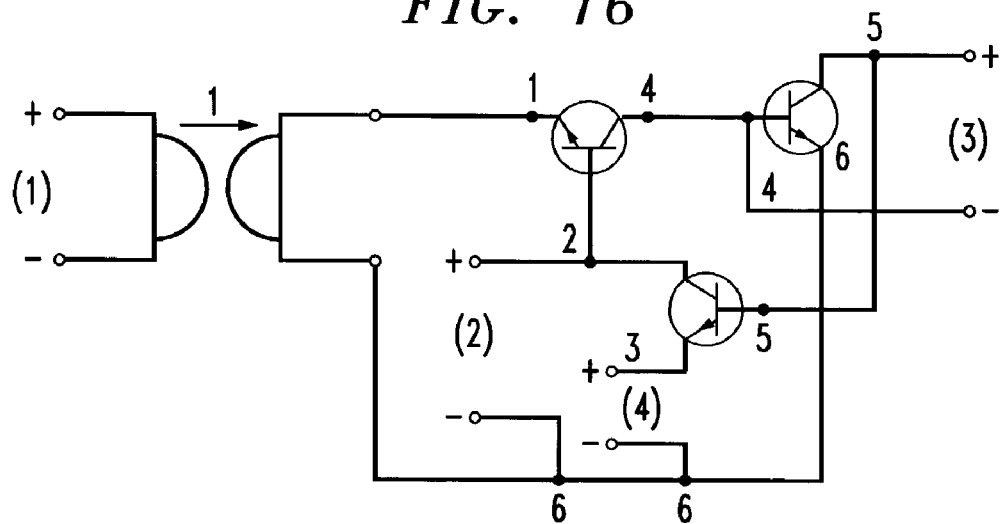
FIGS. 16 and 17 illustrate two unbiased transistor-resistor realizations of a Positive Impedance Multiplication-Division Operator network element.
Figure 17:
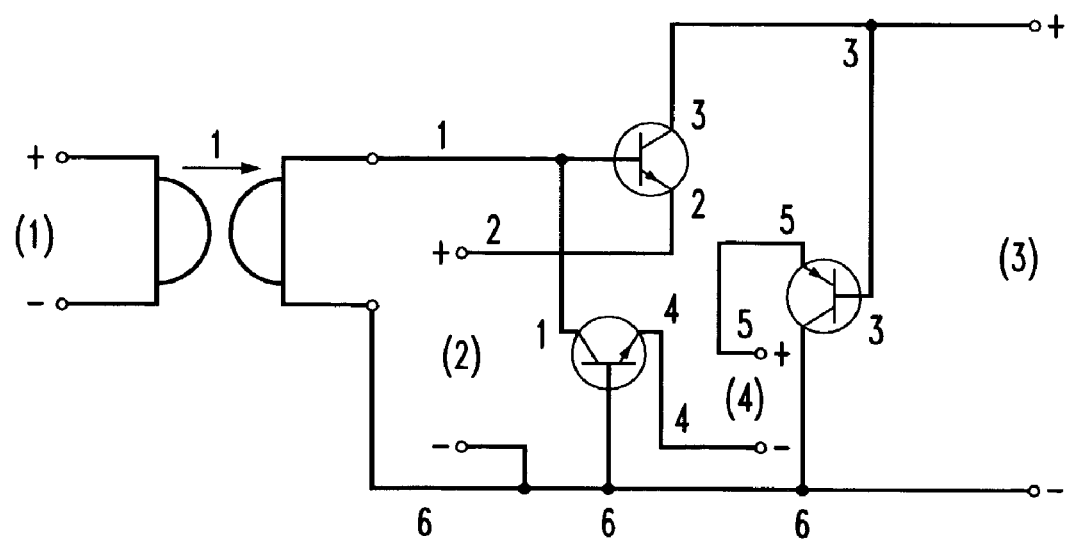

The transistorized realization of the Positive Impedance Multiplication-Division Operator is determined by using the equivalence of FIG. 11 in FIG. 15 as shown by the two realizations of FIG. 15 using bipolar transistors in FIGS. 16 and 17, which is convenient for IC fabrication of a Positive Impedance Multiplication-Division Operator. Observe that the transistorized realizations of FIGS. 16 and 17 do not show biasing considerations.

Figure 18:
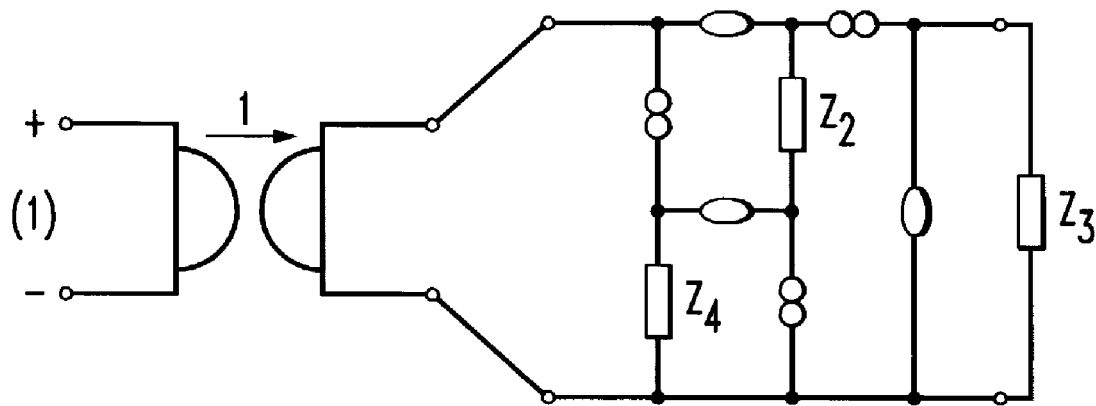
FIG. 18 illustrates in block diagram form an alternative nullator-norator equivalent model of the circuit of FIG. 6.
Figure 19:
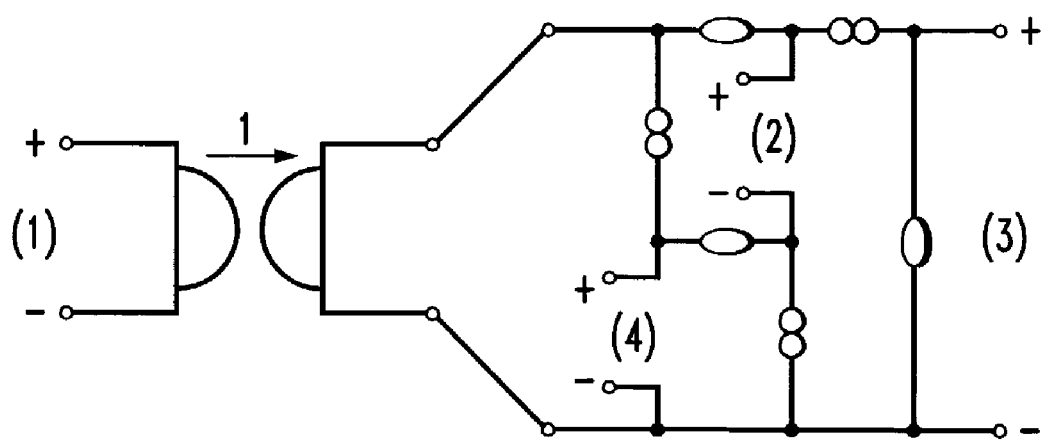
FIG. 19 illustrates a nullator-norator equivalent model of a Positive Impedance Multiplication-Division Operator network element that is derived from the circuit of FIG. 18.
Figure 20:
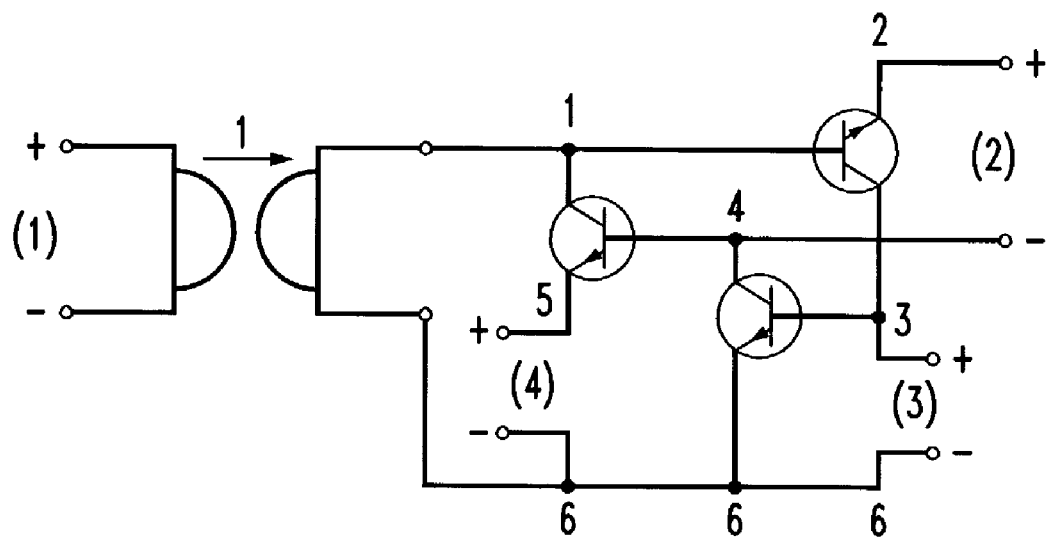
FIGS. 20 and 21 illustrate two unbiased transistor-resistor realizations of a Positive Impedance Multiplication-Division Operator network element that is derived from the circuit of FIG. 19.
Figure 21:
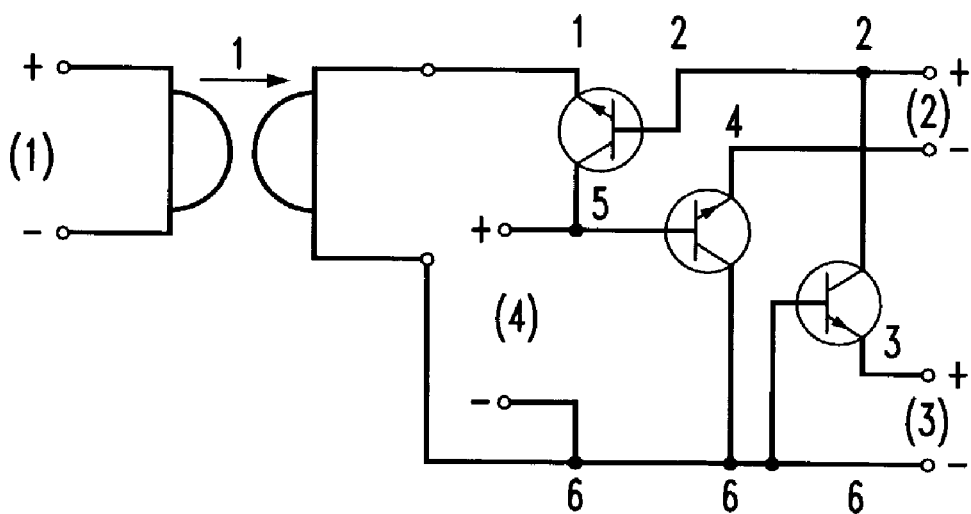

A gyrator has many possible practical norator-nullator equivalent models. Consideration of symmetry groups, first associated with the admittance matrix, and at a secondary level associated with that part of FIG. 14 that is obtained after deleting the standard gyrator as a basic combinatorial object, yields non-trivial alternatives. Consequently, so does a Positive Impedance Multiplication-Division Operator. FIG. 16 serves as an illustration of the fact that each norator-nullator equivalent model yields at least one distinct transistor-resistor realization. A second such realization, shown in FIG. 17, also follows immediately by inspection from FIG. 15. As a final example of alternative norator-nullator realizations, we show one more norator-nullator equivalent model of a gyrator in FIG. 18, with the corresponding norator-nullator equivalent model of the Positive Impedance Multiplication-Division Operator in FIG. 19. Finally, FIGS. 20 and 21 show two distinct unbiased transistor-resistor realizations of the Positive Impedance Multiplication-Division Operator derived from FIG. 19.

Figure 22:
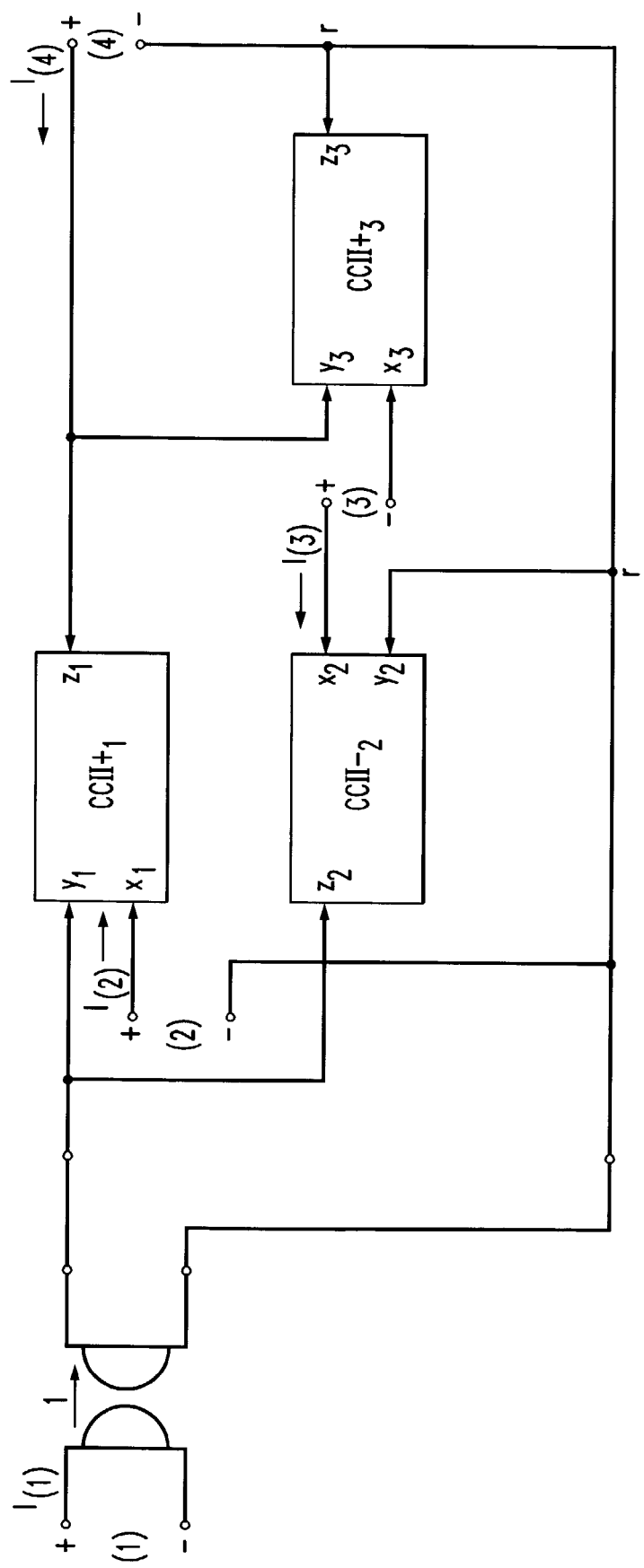
FIG. 22 illustrates in block diagram form the realization of a Positive Impedance Multiplication-Division Operator network element that is derived from the circuit of FIG. 15 using ideal second generation current conveyors.

A more effective transistor-resistor realization of a Positive Impedance Product Operator is attained by using second generation current conveyors (CCII) that can be directly converted to straightforward IC designs using already published techniques and implementations. The CCII realization of the Positive Impedance Multiplication-Division Operator is obtained by using the equivalence of FIG. 13 in FIG. 15 which admits two distinct choices for assigning the norator-nullator pairs to CCIIs, which can be represented by their respective labeling schemes. Only one of the possible realizations of FIG. 15 using ideal CCIIs is shown in FIG. 22.

Figure 23:
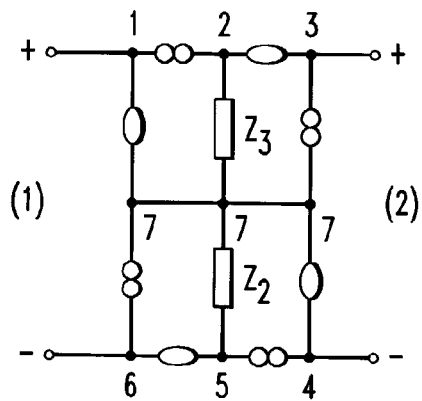
FIG. 23 illustrates a nullator-norator equivalent model of a negative impedance inverter.
Figure 24:
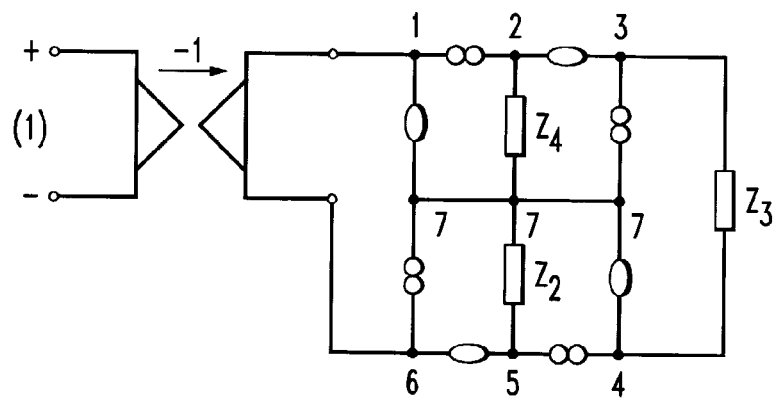
FIG. 24 illustrates a nullator-norator equivalent model of the circuit of FIG. 8 using a standard negative impedance inverter.
Figure 25:
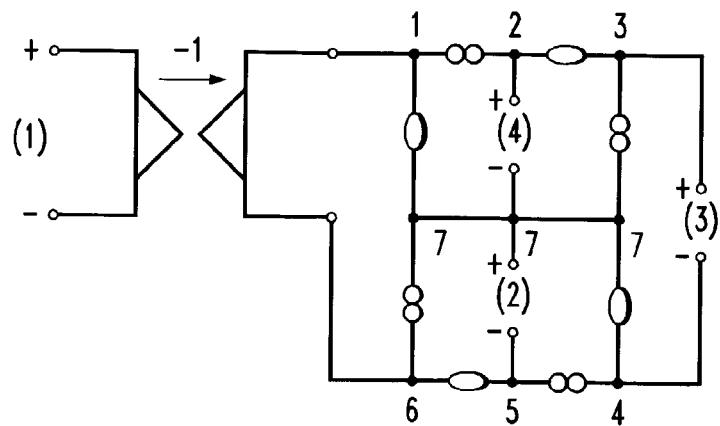
FIG. 25 illustrates a nullator-norator equivalent model of a Positive Impedance Multiplication-Division Operator network element that is derived from the circuit of FIG. 24.
Figure 26:
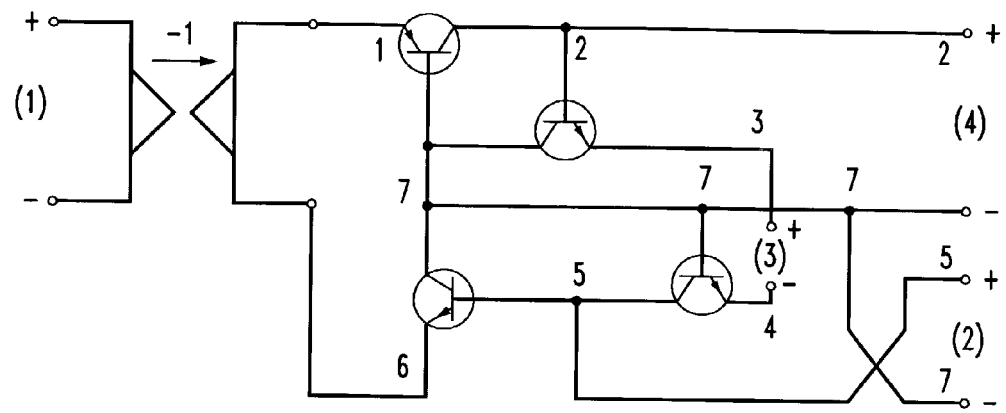
FIGS. 26 and 27 illustrate two unbiased transistor-resistor realizations of a Positive Impedance Multiplication-Division Operator network element that is derived from the circuit of FIG. 25.
Figure 27:
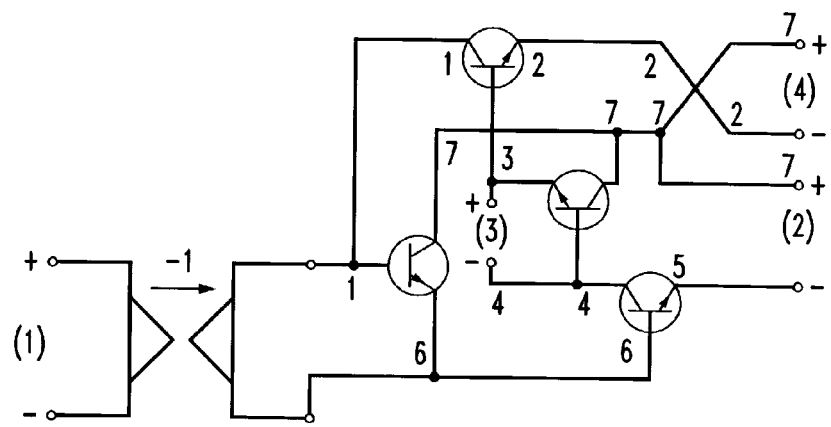

Negative Impedance Inverters and Transistor-Resistor Realization of Positive Impedance Multiplication-Division Operator Equivalent models for negative impedance inverters (Negative Impedance Inverter) using norators and nullators have been proposed such as a typical model, shown in FIG. 23, which corresponds to a 4-transistor implementation. FIG. 24 shows the implementation of FIG. 8 using this equivalent norator-nullator model. The rest of the synthesis for Positive Impedance Multiplication-Division Operator is as before. As soon as the branches marked $Z_2$, $Z_3$, and $Z_4$ in FIG. 24 are removed, i.e., replaced with open circuits, the 4-port configuration of FIG. 25 is obtained as the desired norator-nullator equivalent model of a Positive Impedance Multiplication-Division Operator where the impedance seen at port 1 as $Z_{(1)} = Z_2^{-1} Z_3 Z_4^{-1}$. FIGS. 26 and 27 show two unbiased transistor realizations of the Positive Impedance Multiplication-Division Operator for the specific norator-nullator equivalent model selected for the Negative Impedance Inverter. Just as for the gyrators, a Negative Impedance Inverter has many possible practical norator-nullator equivalent models; consequently, so does a Positive Impedance Multiplication-Division Operator.

Reciprocal of the Product of Two Impedance Functions

Equation (8) immediately reveals that by setting $Z_3 = 1\Omega$, we obtain the pure reciprocal of the product of two impedance functions. The driving point impedance function of the schematics in FIGS. 6 and 8 for this specialized Positive Impedance Multiplication-Division Operator is obtained as:

$$Z_{(1)}(s) = \frac{1}{Z_2(s) Z_4(s)}. \tag{9}$$

This version of the Positive Impedance Multiplication-Division Operator and all the associated implementations obtained from FIG. 15 through FIG. 22 may be considered as a new circuit element.

Conclusion

The non-reciprocal 4-port network element, termed Positive Impedance Multiplication-Division Operator, has the following property: if three 2-terminal impedances, $Z_2$, $Z_3$, and $Z_4$ are connected at ports 2, 3 and 4 of a $_1$PIMDOR$_{2,4}^3$, the input impedance offered by this loaded 4-port at port 1 is $Z_{(1)}=Z_2^{-1}Z_3Z_4^{-1}$. As a single network element, Positive Impedance Multiplication-Division Operator offers a direct and general mechanism for multiplication and division of 2-terminal impedance functions, and hence adds significant flexibility in solving the general synthesis problems for immittance functions as a basic circuit element.

Negative Impedance Multiplication-Division Operator

An alternative Impedance Multiplication-Division Operator is the Negative Impedance Multiplication-Division Operator (NIMDOR), which is analogous to the above-described Positive Impedance Multiplication-Division Operator. The Negative Impedance Multiplication-Division Operator produces an input impedance that is a result of the multiplication or division of two arbitrary real rational functions, symbolically represented in FIG. 28. The arrow in FIG. 28 denotes the network element to be non-reciprocal. This Negative Impedance Multiplication-Division Operator is analogous to the Positive Impedance Multiplication-Division Operator described above and the following description characterizes the differences between these two network elements.

Using FIG. 28, the distinguishing property of this network element as follows: if three 2-terminal impedances, $Z_2(s)$, $Z_3(s)$, and $Z_4(s)$ are connected at ports 2, 3 and 4 of a $_1$NIMDOR$_{2,4}^3$, the input impedance offered by this loaded 4-port at port 1 is $Z_{(1)}(s)=-Z_2^{-1}(s)Z_3(s)Z_4^{-1}(s)$ Ports 2 and 4 are the (impedance) inverting ports; port 3 is the non-inverting port. As a single network element, Negative Impedance Multiplication-Division Operator thus offers a direct and completely general mechanism for sign-inverted multiplication and division of 2-terminal impedance functions. The availability of such an element obviously adds significant flexibility in solving the general synthesis problems for immittance functions. For example, by setting $Z_3(s)\equiv 1\Omega$, $Z_{(1)}(s)=-Z_2^{-1}(s)Z_4^{-1}(s)$ is obtained, i.e., a sign-inverted reciprocal of the product of two impedance functions.

The following hybrid matrix conveniently expresses the relationship among the voltage- and current-variables at the ports of a $_1$NIMDOR$_{2,4}^3$:

$$\begin{bmatrix} V_1 \\ V_2 \\ I_3 \\ V_4 \end{bmatrix} = \begin{bmatrix} 0 & 1 & 0 & 0 \\ 0 & 0 & 1 & 0 \\ 0 & 0 & 0 & -1 \\ 1 & 0 & 0 & 0 \end{bmatrix} \begin{bmatrix} I_1 \\ I_2 \\ V_3 \\ I_4 \end{bmatrix}, \quad (10)$$

where $V_j$ and $I_j$ denote the voltage- and current-variables at the j th port, j=1, 2, 3, 4, respectively.

Controlled Source Representation

Figure 28:
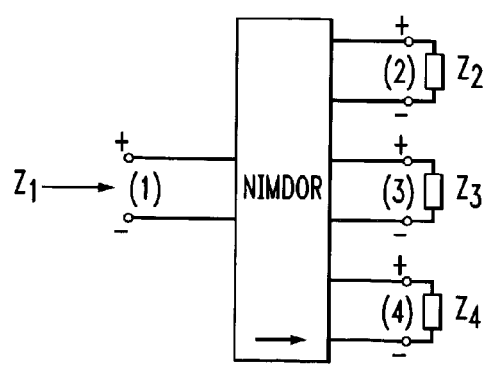
FIG. 28 illustrates in block diagram form a representation of a Negative Impedance Multiplication-Division Operator network element.
Figure 29:
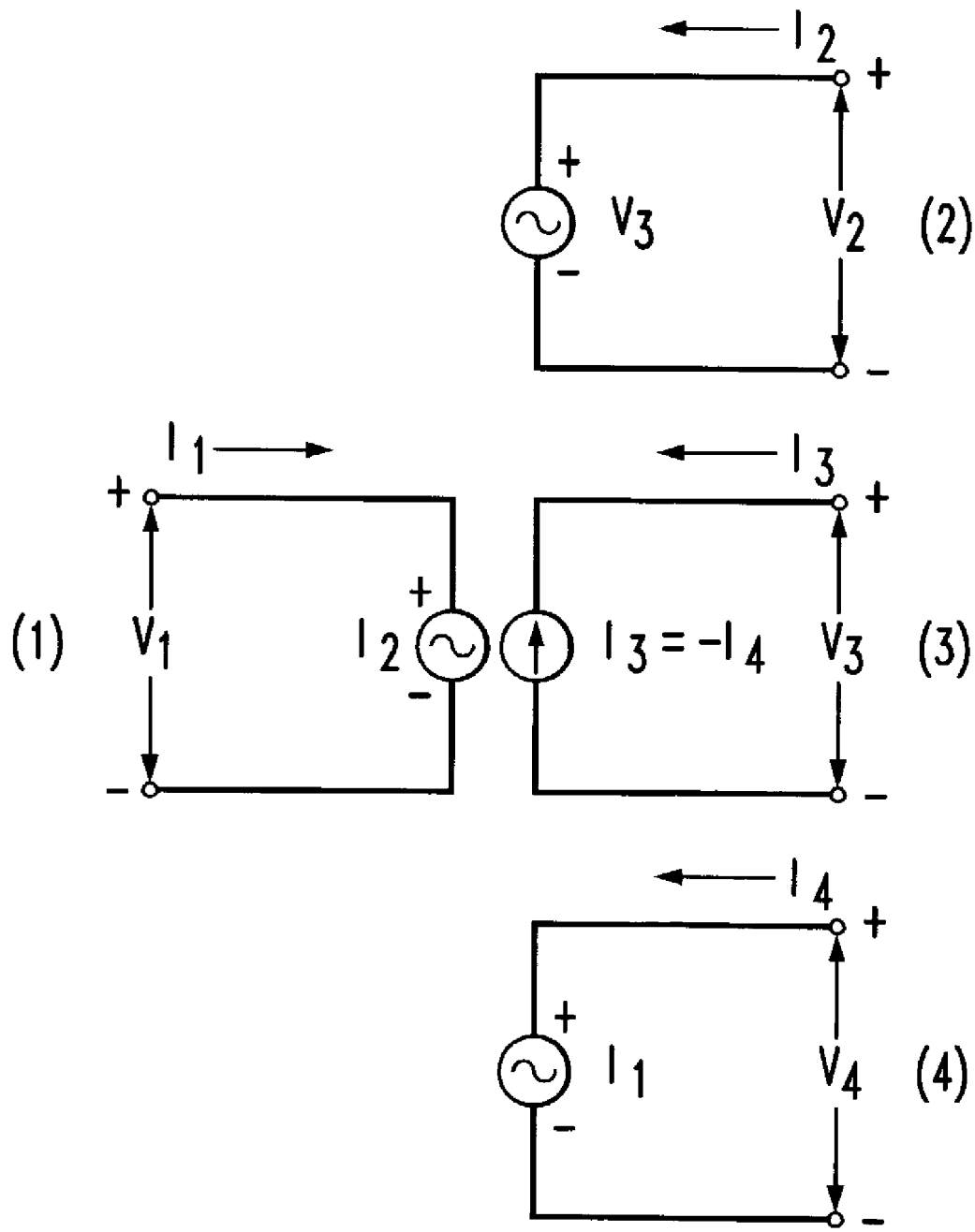
FIG. 29 illustrates a controlled source representation of the Negative Impedance Multiplication-Division Operator network element of FIG. 28.

The hybrid matrix of Equation (10) immediately yields the controlled source representation of FIG. 29. Referring back to FIG. 28, assume that the 2-terminal impedances, $Z_2$, $Z_3$, and $Z_4$, are connected as loads at ports 2, 3, and 4 of the circuit of FIG. 29, respectively. Since all port currents are shown to be flowing inside:

$$V_1 = +I_2 = \frac{V_2}{Z_2} = \frac{V_3}{Z_2} = \frac{I_3 Z_3}{Z_2} = \frac{(-I_4)Z_3}{Z_2} = -\frac{V_4}{Z_4} \times \frac{Z_3}{Z_2} = -\frac{I_1}{Z_4}\frac{Z_3}{Z_2}.$$

Hence, the input impedance seen at port 1, $Z_{(1)}$, is given by:

$$Z_{(1)} = \frac{V_1}{I_1} = -Z_2^{-1}Z_3Z_4^{-1}. \quad (11)$$

The analysis provided above for the Positive Impedance Multiplication-Division Operator can be directly adapted to reflect the negative impedance aspect of the Negative Impedance Multiplication-Division Operator, and such a description is omitted herein for the sake of brevity.

General Positive Impedance Multiplication-Division Operator

An extension of the above-described Positive Impedance Multiplication-Division Operator is the active non-reciprocal 2(n+1)-port, n≥2, network element called General Positive Impedance Multiplication-Division Operator which has one input port and 2n+1 output ports, one of which is a distinguished output port. The defining property of this element is that if 2n+1 2-terminal impedances, $Z_2$, $Z_3$, ..., $Z_{2n+1}$, and $Z_L$ are connected at ports 2, 3, ..., 2n, and the distinguished output port L of a General Positive Impedance Multiplication-Division Operator respectively, the input impedance offered by this loaded multi-port at port 1 can be of one the two forms:

$$Z_{(1)} = Z_L \prod_{k=2}^{2n+1} Z_k^{-1}, \text{ or } Z_{(1)} = Z_L \prod_i Z_i \times \prod_j Z_j^{-1},$$

with the constraints on i and j as explained below. As a single network element, General Positive Impedance Multiplication-Division Operator thus offers a direct yet general mechanism for multiplication and division of 2-terminal impedance functions. This network element allows simpler and more direct synthesis of driving point impedance functions and should be especially useful for analog RF and microwave applications. For example, by setting $Z_L$ and certain $Z_i$'s to 1Ω, $$Z_{(1)} = \prod_j Z_j^{-1}$$

is obtained, i.e., a pure reciprocal of the product of an arbitrary finite number of impedance functions.

Physical realizations of General Positive Impedance Multiplication-Division Operators are done most naturally by using the above-described non-reciprocal active 4-port Positive Impedance Multiplication-Division Operator. If three 2-terminal impedances $Z_2$, $Z_3$, and $Z_4$ are connected at ports 2, 3 and 4 of a Positive Impedance Multiplication-Division Operator, respectively, the input impedance offered by this loaded multi-port at port 1 is $Z_{(1)}=Z_2^{-1}Z_3Z_4^{-1}$, as shown in FIG. 1. We use the symbol $$_1PIMDOR_{2,4}^3$$

to denote that port 1 is the input port, ports 2 and 4 corresponds to taking the reciprocal of impedance functions, and port 3 corresponds to ordinary multiplication of impedance functions; we shall call ports 2 and 3 as the "impedance inversion" ports and port 3 as the "distinguished" port.

Figure 30:
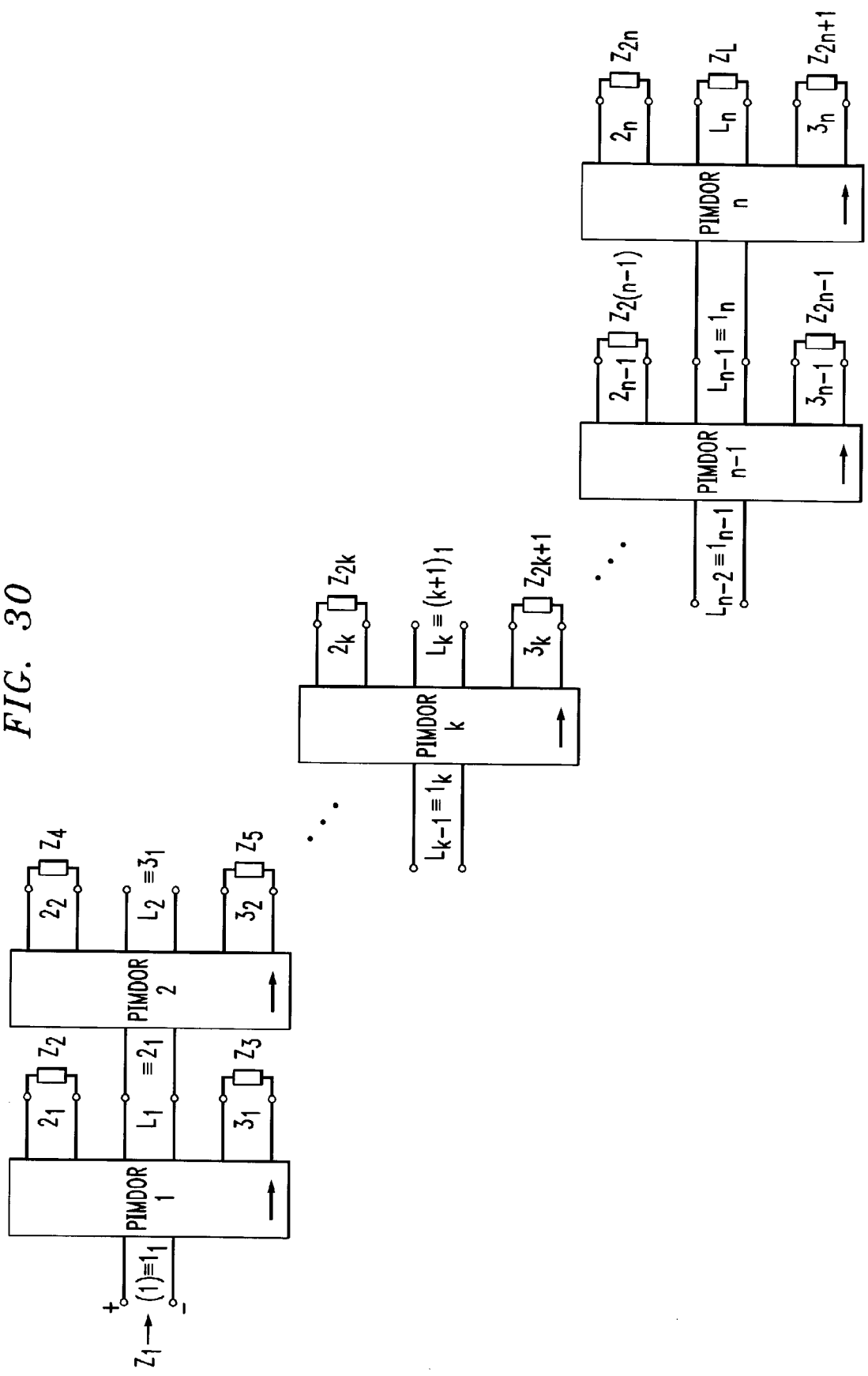
FIGS. 30 and 31 illustrate in block diagram form alternative representations of a Generalized Positive Impedance Multiplication-Division Operator network element implemented as a cascade of n Positive Impedance Multiplication-Division Operator network elements.

A 2(n+1)-port General Positive Impedance Multiplication-Division Operator, n>1, is created by cascading n Positive Impedance Multiplication-Division Operators and appropriately terminating them with 2-terminal impedances. From symmetry considerations, there are two possibilities, respectively denoted as the Type I and Type II configurations. Consider the cascade connection representing a Type I General Positive Impedance Multiplication-Division Operator shown in FIG. 30 where each Positive Impedance Multiplication-Division Operator is terminated by a 2-terminal impedance at its impedance inversion ports. Except for the last Positive Impedance Multiplication-Division Operator, the distinguished port is used to cascade one Positive Impedance Multiplication-Division Operator to the next. The distinguished port is terminated by the load $Z_L$ for the last Positive Impedance Multiplication-Division Operator. Consider the k-th Positive Impedance Multiplication-Division Operator in FIG. 30, with k ranging over 1, 2, ..., n−1. Let $1_k$, $2_k$, $3_k$ and $L_k$ respectively denote the input, the two impedance inversion ports, and the distinguished port of the k-th Positive Impedance Multiplication-Division Operator. As shown in FIG. 30, ports $2_k$ and $3_k$ are terminated with the 2-terminal impedances $Z_{2k}$ and $Z_{2k+1}$, respectively, while port $L_k$ is terminated with the (k+1)-th Positive Impedance Multiplication-Division Operator for k=1, 2, ..., n−1; port $L_k$ is terminated with the load $Z_L$ for k=n.

It is easy to determine $Z_{(1)}$ for the Type I General Positive Impedance Multiplication-Division Operator of FIG. 30 by induction. First consider the case of the n-th Positive Impedance Multiplication-Division Operator terminated with loads $Z_{2n}$, $Z_{2n+1}$ and $Z_L$ at ports $2_n$, $3_n$, and $L_n$ respectively. By definition, the (n−1)-th Positive Impedance Multiplication-Division Operator, terminated with the loads $Z_{2(n-1)}$ and $Z_{2n-1}$ at ports $2_{n-1}$ and $3_{n-1}$, respectively, is also effectively terminated with the load $$Z_{2n}^{-1}Z_L Z_{2n+1}^{-1}$$

at port $L_{n-1}$. Hence, the impedance seen at port $1_{n-1}$ is $Z_{2(n-1)}^{-1}(Z_{2n}^{-1}Z_L Z_{2n+1}^{-1})Z_{2n-1}^{-1} = Z_{2(n-1)}^{-1}Z_{2n-1}^{-1}Z_{2n}^{-1}Z_{2n+1}^{-1}Z_L$.

Continuing in this manner, it is evident that the impedance offered by the loaded k-th Positive Impedance Multiplication-Division Operator at port $1_k$ of the Type I General Positive Impedance Multiplication-Division Operator in FIG. 2 is $$Z_{2k}^{-1}$$

×(impedance seen at port $1_{k+1}$ of the loaded $(k+1)$-th Positive Impedance Multiplication-Division Operator) $\times Z_{2k+1}^{-1} =$ $$Z_L \times \prod_{i=2k}^{2n+1} Z_i^{-1}.$$

Specifically, for k=1, the impedance seen at the input or port (1) of the Type I General Positive Impedance Multiplication-Division Operator is obtained as:

$$Z_{(1)} = Z_L \times \prod_{i=2}^{2n+1} Z_i^{-1} \qquad (12)$$

Except for the adjustment of appropriate indices, the input impedance seen at a Type I General Positive Impedance Multiplication-Division Operator is invariant with respect to the choice of the impedance-inversion ports.

Figure 31:
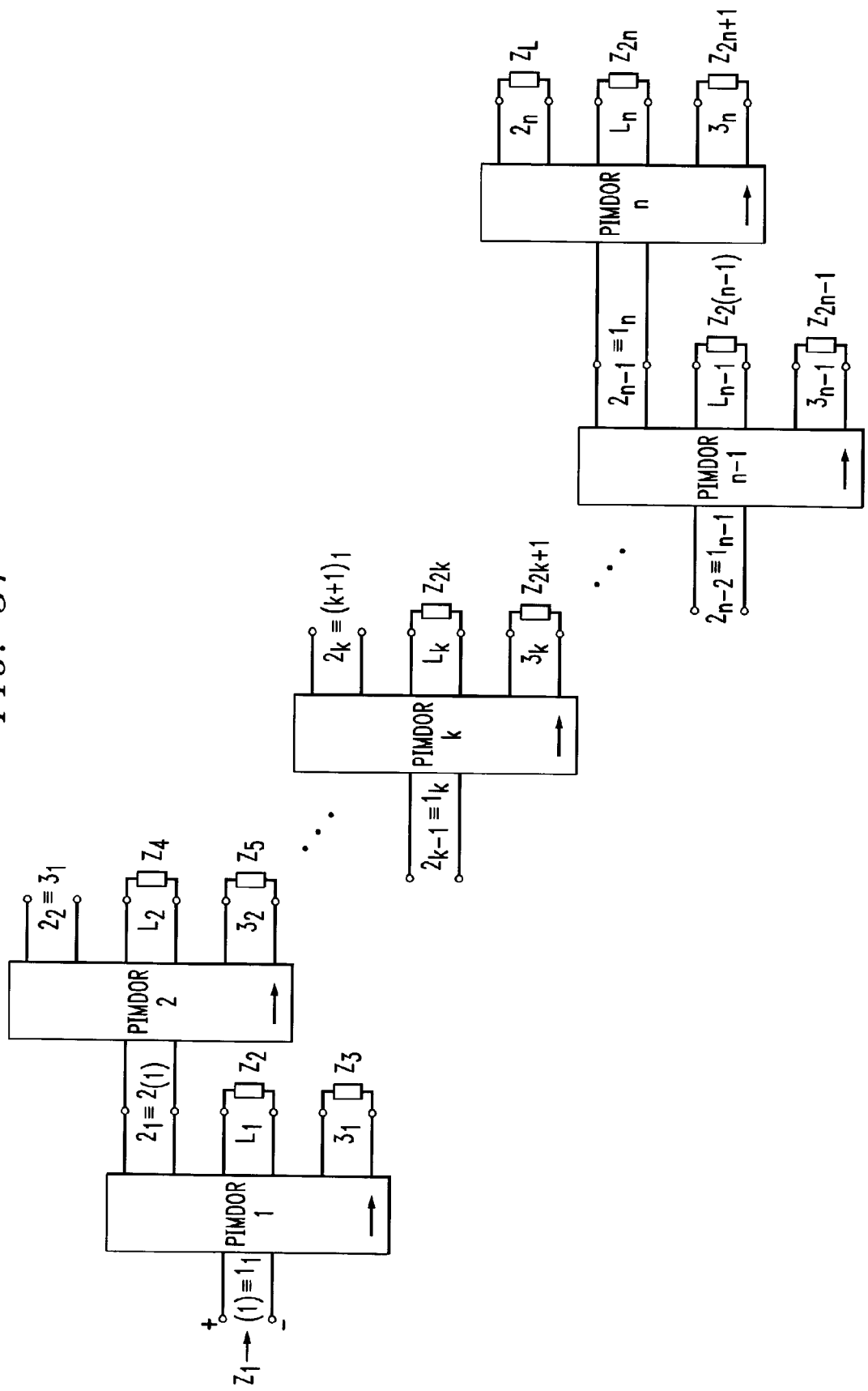

The cascade connection representing a Type II General Positive Impedance Multiplication-Division Operator is shown in FIG. 31, where each Positive Impedance Multiplication-Division Operator is terminated by a 2-terminal impedance at one of its impedance inversion ports, as well as at the distinguished port. Except for the last Positive Impedance Multiplication-Division Operator, the other impedance inversion port is used to cascade one Positive Impedance Multiplication-Division Operator to the next. The distinguished port is terminated by the load $Z_L$ for the last Positive Impedance Multiplication-Division Operator. Consider the k-th Positive Impedance Multiplication-Division Operator in FIG. 31, with k ranging over 1, 2, ..., n−1. As shown in FIG. 3, ports $L_k$ and $3_k$ are terminated with the 2-terminal impedances $Z_{2k}$ and $Z_{2k+1}$, respectively, while port $2_k$ is terminated with the (k+1)-th Positive Impedance Multiplication-Division Operator for k=1, 2, ..., n−1; port $2_k$ is terminated with the load $Z_L$ for k=n.

We determine $Z_{(1)}$ for the Type II General Positive Impedance Multiplication-Division Operator of FIG. 31 by induction as before. First consider the case of the n-th Positive Impedance Multiplication-Division Operator terminated with loads $Z_L$, $Z_{2n}$, and $Z_{2n+1}$ at ports $2_n$, $L_n$, and $3_n$, respectively. By definition, the (n−1)-th Positive Impedance Multiplication-Division Operator, terminated with the loads $Z_{2(n-1)}$ and $Z_{2n-1}$ at ports $L_{n-1}$ and $3_{n-1}$, respectively, is also effectively terminated with the load $$(Z_L^{-1} Z_{2n} Z_{2n+1}^{-1})$$

at port $2_{n-1}$. Hence, the impedance seen at port $1_{n-1}$ is $$(Z_L^{-1} Z_{2n} Z_{2n+1}^{-1})^{-1} Z_{2(n-1)} Z_{2n-1}^{-1}.$$

Continuing in this manner, and keeping track of the exponent inversion at each stage, it is evident that the impedance offered by the loaded k-th Positive Impedance Multiplication-Division Operator at port $1_k$ of the Type II General Positive Impedance Multiplication-Division Operator in FIG. 31 is $Z_{2k}\times$(impedance seen at port $1_{k+1}$ of the loaded (k+1)-th Positive Impedance Multiplication-Division Operator)$^{(-1)}\times Z_{2k+1}^{-1}$. Specifically, for k=1, the impedance seen at the input or port (1) of the Type II General Positive Impedance Multiplication-Division Operator is obtained as:

$$Z_{(1)} = Z_L^{(-1)^{(n-1)}} \times \prod_{i=2}^{n-1} (Z_{2i} Z_{2i+1}^{-1})^{(-1)^{(i-1)}} \quad (13)$$

For example, for n=5, i.e., implementations consisting of five Positive Impedance Multiplication-Division Operators in cascade, the input impedance seen at Type I and Type II General Positive Impedance Multiplication-Division Operators are, respectively, as follows:

Type I: $Z_{(1)}=Z_L\times Z_2^{-1}Z_3^{-1}Z_4^{-1}Z_5^{-1}Z_6^{-1}Z_7^{-1}Z_8^{-1}Z_9^-$
$_1Z_{10}^{-1}Z_{11}^{-1}$ (14)

Type II: $Z_{(1)}=Z_L\times Z_2 Z_3^{-1}Z_4^{31}{}^1 Z_5 Z_6 Z_7^{-1}Z_8^-$
$_1Z_9 Z_{10}Z_{11}^{-1}$ (15)

Observe the pattern in the inversion of exponents for the Type General Positive Impedance Multiplication-Division Operator. Except for the adjustment of appropriate indices, the input impedance seen at a Type II General Positive Impedance Multiplication-Division Operator is invariant with respect to the choice of the impedance-inversion ports.

Alternative Realizations of General Positive Impedance Multiplication-Division Operators Using Positive Impedance Multiplication-Division Operators and Negative Impedance Multiplication-Division Operators Cascaded Positive Impedance Multiplication-Division Operators have been used above to realize a General Positive Impedance Multiplication-Division Operator. Another family of network elements, called Negative Impedance Multiplication-Division Operators, can be used together with the Positive Impedance Multiplication-Division Operators for such realizations. A Negative Impedance Multiplication-Division Operator, described above, is also a 4-port non-reciprocal element like Positive Impedance Multiplication-Division Operator, the distinguishing characteristics being that when loaded with two impedances $Z_2$ and $Z_3$ at ports 2 and 3, a Negative Impedance Multiplication-Division Operator produces the negative of their product at port 1; i.e., the impedance seen at port 1 is $-Z_2 Z_3$.

Figure 32:
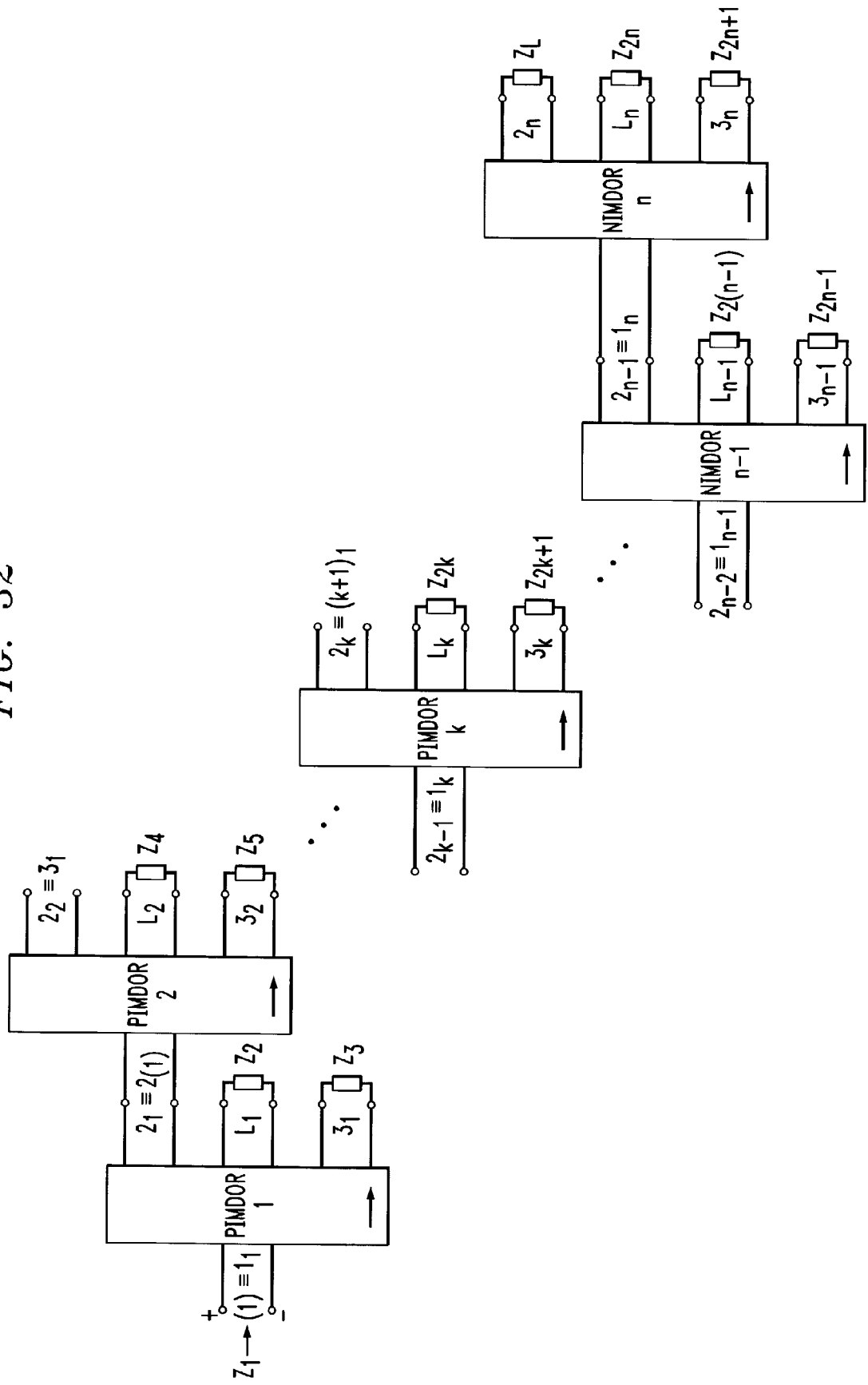
FIGS. 32 and 33 illustrate in block diagram form alternative representations of a Generalized Positive Impedance Multiplication-Division Operator network element implemented as a cascade of two Negative Impedance Multiplication-Division Operator network elements and (n−2) Positive Impedance Multiplication-Division Operator network elements.
Figure 33:
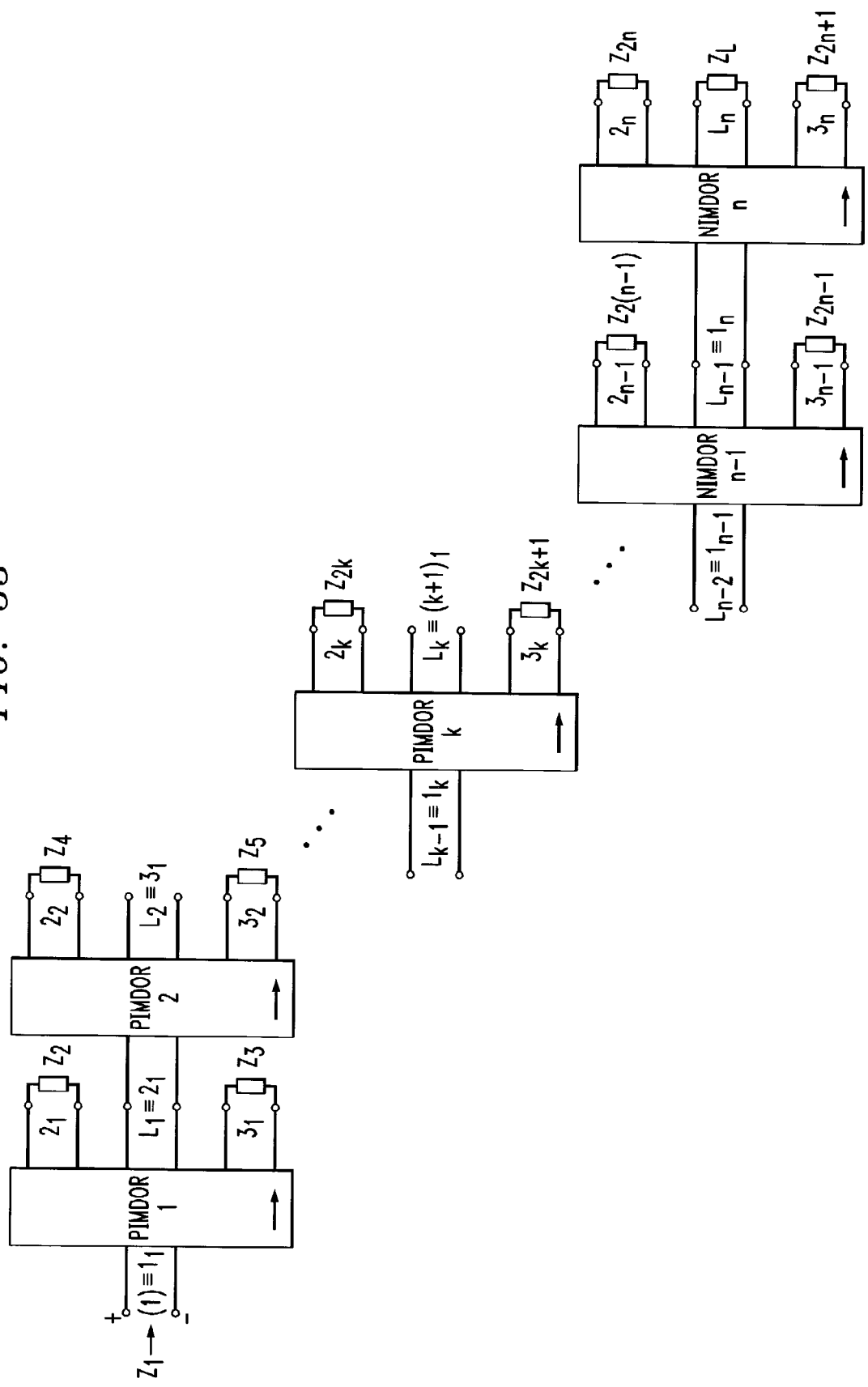

Observe that the General Positive Impedance Multiplication-Division Operator cascades of FIGS. 30 and 31 could have been constructed with an even number (j) of Negative Impedance Multiplication-Division Operators and the rest (2n+1−j) as Positive Impedance Multiplication-Division Operators. As long as there are an even number of Negative Impedance Multiplication-Division Operators in cascade, the sign of the overall product seen at the input of the General Positive Impedance Multiplication-Division Operator is always positive. Indeed, the even number of Negative Impedance Multiplication-Division Operators may be interspersed with Positive Impedance Multiplication-Division Operators anywhere in the cascade preserving the desired impedance multiplication property of the General Positive Impedance Multiplication-Division Operator—the effect is permutation invariant with respect to the placement of the elements themselves. A specific implementation of a Type I General Positive Impedance Multiplication-Division Operator using two Negative Impedance Multiplication-Division Operators at the end of a cascade of Positive Impedance Multiplication-Division Operators is obtained from FIG. 30 and is shown in FIG. 32. FIG. 33 is the counterpart of FIG. 31 for Type II General Positive Impedance Multiplication-Division Operators and is obtained from FIG. 29.

Reciprocal of the Product of An Arbitrary Finite Number of Impedance Functions

Equation (12) immediately reveals that by setting $Z_L=1\Omega$, the pure reciprocal of the product of an arbitrary finite number of impedance functions is obtained. The driving point impedance function for this specialized Type I General Positive Impedance Multiplication-Division Operator is obtained as:

$$Z_{(1)}(s) = \frac{1}{\prod_{i=2}^{2n+1} Z_i(s)}. \quad (16)$$

This version of the Type I General Positive Impedance Multiplication-Division Operator and the associated implementation obtained from FIG. 30 may be considered as a new circuit element.

Conclusion

The active non-reciprocal 2(n+1)-port, $n\geq 1$, network element, termed General Positive Impedance Multiplication-Division Operator, has one input port and 2n+1 output ports, one of which is a distinguished output port. The defining property of this element is that if 2n+1 2-terminal impedances, $Z_2, Z_3, \ldots, Z_{2n+1}$, and $Z_L$ connected at ports $2, 3, \ldots, 2n$, and the distinguished output port L of a General Positive Impedance Multiplication-Division Operator respectively, the input impedance offered by this loaded multi-port at port 1 can be of one the two forms:

$$Z_{(1)} = Z_L \prod_{k=2}^{2n+1} Z_k^{-1}, \text{ or } Z_{(1)} = Z_L \prod_i Z_i \times \prod_j Z_j^{-1}.$$

General Negative Impedance Multiplication-Division Operator

An alternative Impedance Multiplication-Division Operator is the General Negative Impedance Multiplication-Division Operator (NIMDOR), which is analogous to the above-described General Positive Impedance Multiplication-Division Operator. The General Negative Impedance Multiplication-Division Operator produces an input impedance that is a result of the multiplication or division of two arbitrary real rational functions. This General Negative Impedance Multiplication-Division Operator is analogous to the General Positive Impedance Multiplication-Division Operator described above and the following description characterizes the differences between these two network elements.

The General Negative Impedance Multiplication-Division Operator has a distinguishing property that if 2n+1 2-terminal impedances, $Z_2(s), Z_3(s), \ldots, Z_{2n}(s)$, and $Z_L(s)$ are connected at ports $2, 3, \ldots, 2n$, and the distinguished output port of a General Negative Impedance Multiplication-Division Operator respectively, the input impedance offered by this loaded multi-port at port 1 can be of one the two forms:

$$Z_{(1)}(s) = -Z_L(s) \prod_{k=2}^{2n} Z_k^{-1}(s), \text{ or}$$

$$Z_{(1)}(s) = -Z_L(s) \prod_i Z_i(s) \times \prod_j Z_j^{-1}(s),$$

with the constraints on i and j as explained below.

As a single network element, General Negative Impedance Multiplication-Division Operator thus offers a direct yet completely general mechanism for sign-inverted multiplication and division of 2-terminal impedance functions. The availability of such an element obviously adds significant flexibility in solving the general synthesis problems for immittance functions. For example, by setting $Z_L$ and certain $Z_i$'s to 1Ω, we immediately obtain $$Z_{(1)}(s) = -\prod_j Z_j^{-1}(s),$$

i.e., a sign-inverted reciprocal of the product of an arbitrary finite number of impedance functions.

Physical realizations of General Negative Impedance Multiplication-Division Operators are done most naturally by using two types of non-reciprocal active 4-ports called Negative Impedance Multiplication-Division Operator and Positive Impedance Multiplication-Division Operator, represented in FIG. 28 and FIG. 1, respectively. A Negative Impedance Multiplication-Division Operator is a special case of a 2(n+1)-port General Negative Impedance Multiplication-Division Operator with n=1. If three 2-terminal impedances $Z_2$, $Z_3$, and $Z_4$ are connected at ports 2, 3 and 4 of a Negative Impedance Multiplication-Division Operator, respectively, the input impedance offered by this loaded multi-port at port 1 is $Z_{(1)} = -Z_2^{-1} Z_3 Z_4^{-1}$, as shown in FIG. 28. The symbol $_1\text{NIMDOR}_{2,4}^3$ is used to denote that port 1 is the input port, ports 2 and 4 corresponds to taking the reciprocal of impedance functions, and port 3 corresponds to ordinary multiplication of impedance functions; ports 2 and 3 are the "impedance inversion" ports and port 3 is the "distinguished" port. A Positive Impedance Multiplication-Division Operator is the positive counterpart of a Negative Impedance Multiplication-Division Operator in that if three 2-terminal impedances $Z_2$, $Z_3$, and $Z_4$ are connected at ports 2, 3 and 4 of a Positive Impedance Multiplication-Division Operator, respectively, the input impedance offered by this loaded multi-port at port 1 is $Z_{(1)} = Z_2^{-1} Z_3 Z_4^{-1}$, as shown in FIG. 1. The symbol $_1\text{PIMDOR}_{2,4}^3$ is used to denote that port 1 is the input port, ports 2 and 4 corresponds to taking the reciprocal of impedance functions, and port 3 corresponds to ordinary multiplication of impedance functions; ports 2 and 3 are the "impedance inversion" ports and port 3 is the "distinguished" port.

A 2(n+1)-port General Negative Impedance Multiplication-Division Operator, n>1, is created by cascading one Negative Impedance Multiplication-Division Operator and n−1 Positive Impedance Multiplication-Division Operators and appropriately terminating them with 2-terminal impedances. The single Negative Impedance Multiplication-Division Operator could be placed anywhere in the cascade. From symmetry considerations, there are four possibilities, respectively denoted as the Type I, Type II, Type III and Type IV configurations.

Figure 34:
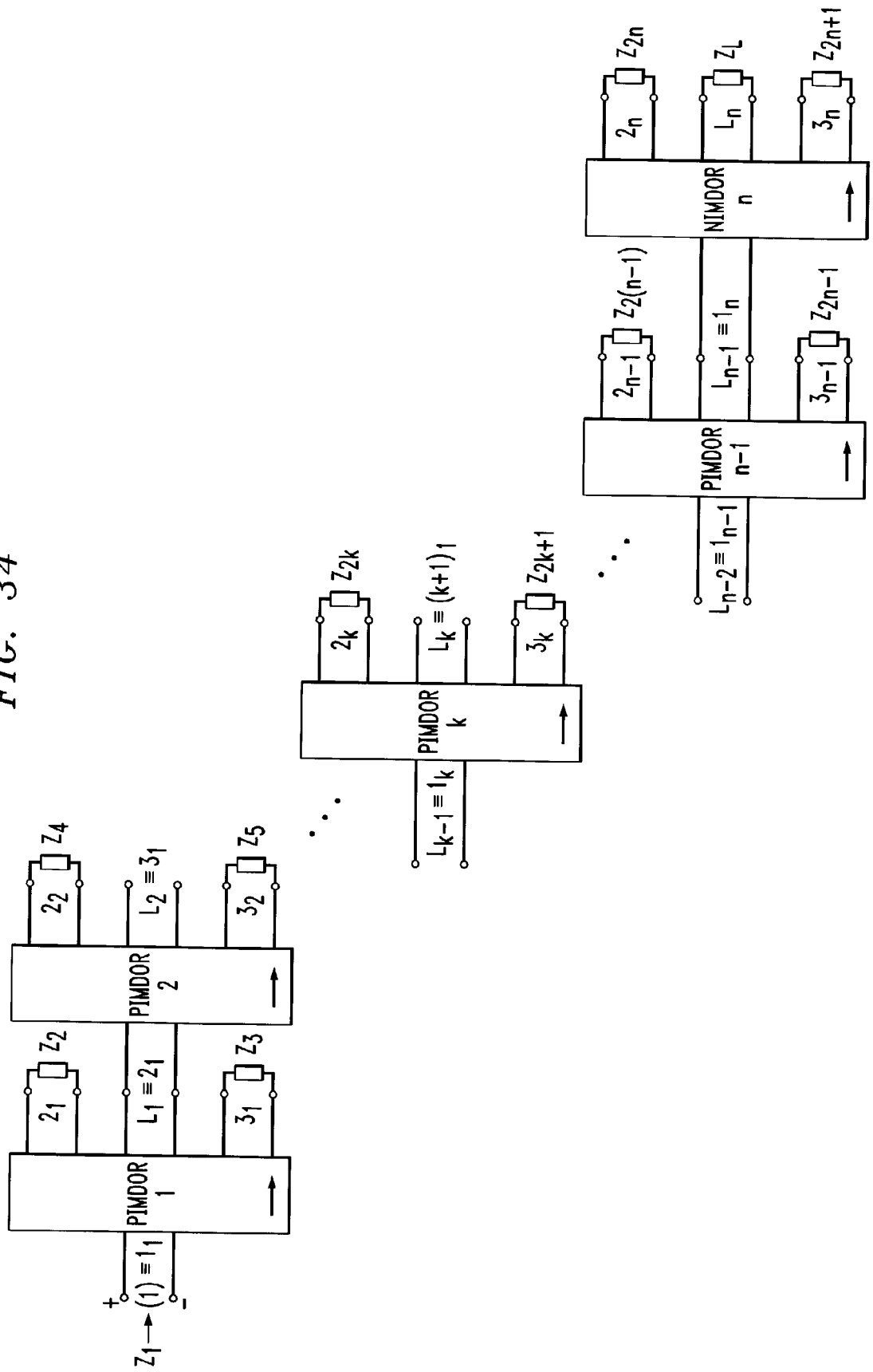
FIGS. 34–37 illustrate in block diagram form alternative representations of a Generalized Negative Impedance Multiplication-Division Operator network element implemented as a cascade of (n−1) Positive Impedance Multiplication-Division Operator network elements and a single Negative Impedance Multiplication-Division Operator network element at the end of the chain.

A Type I General Negative Impedance Multiplication-Division Operator has the single NMDOR placed at the end of the cascade. The complete connection representing a Type I General Negative Impedance Multiplication-Division Operator shown in FIG. 34 where each of the n−1 Positive Impedance Multiplication-Division Operators is terminated by a 2-terminal impedance at its impedance inversion ports, and where the distinguished port is used to cascade one Positive Impedance Multiplication-Division Operator to the next with the single exception of the last Positive Impedance Multiplication-Division Operator. The distinguished port for the last Positive Impedance Multiplication-Division Operator is terminated by the single Negative Impedance Multiplication-Division Operator. Consider the k-th Positive Impedance Multiplication-Division Operator in FIG. 2, with k ranging over 1, 2, . . . , n−1. Let $\mathbf{1}_k$, $\mathbf{2}_k$, $\mathbf{3}_k$ and $L_k$ respectively denote the input, the two impedance inversion ports, and the distinguished port of the k-th Positive Impedance Multiplication-Division Operator. As shown in FIG. 34, ports $\mathbf{2}_k$ and $\mathbf{3}_k$ are terminated with the 2-terminal impedances $Z_{2k}$ and $Z_{2k+1}$, respectively, while port $L_k$ is terminated with the (k+1)-th Positive Impedance Multiplication-Division Operator for k=1, 2, . . . , n−1; port $L_k$ is terminated with the load $Z_L$ for k=n.

It is easy to determine $Z_{(1)}$ for the Type I General Negative Impedance Multiplication-Division Operator of FIG. 34 by induction. First consider the case of the n-th place Negative Impedance Multiplication-Division Operator terminated with loads $Z_{2n}$, $Z_{2n+1}$ and $Z_L$ at ports $\mathbf{2}_n$, $\mathbf{3}_n$, and $L_n$ respectively. By definition, the (n−1)-th Positive Impedance Multiplication-Division Operator, terminated with the loads $Z_{2(n-1)}$ and $Z_{2n-1}$ at ports $\mathbf{2}_{n-1}$ and $\mathbf{3}_{n-1}$, respectively, is also effectively terminated with the load $$-Z_{2n}^{-1} Z_L Z_{2n+1}^{-1}$$

at port $L_{n-1}$. Hence, the impedance seen at port $\mathbf{1}_{n-1}$ is $$-Z_{2(n-1)}^{-1}(Z_{2n}^{-1} Z_L Z_{2n+1}^{-1}) Z_{2n-1}^{-1} = -Z_{2(n-1)}^{-1} Z_{2n-1}^{-1} Z_{2n}^{-1} Z_{2n+1}^{-1} Z_L.$$

Continuing in this manner, it is evident that the impedance offered by the loaded k-th Positive Impedance Multiplication-Division Operator at port $\mathbf{1}_k$ of the Type I General Negative Impedance Multiplication-Division Operator in FIG. 34 is $Z_{2k}^{-1} \times$(impedance seen at port $\mathbf{1}_{k+1}$ of the loaded (k+1)-th Positive Impedance Multiplication-Division Operator $$(k+1)\text{-th Positive Impedance Multiplication-Division Operator}) \times Z_{2k+1}^{-1} =$$

$$-Z_L \prod_{i=2k}^{2n+1} Z_i^{-1}.$$

Specifically, for k=1, the impedance seen at the input or port (1) of the Type I General Negative Impedance Multiplication-Division Operator is:

$$Z_{(1)} = -Z_L \prod_{i=2}^{2n+1} Z_i^{-1} \tag{17}$$

Except for the adjustment of appropriate indices, the input impedance seen at a Type I General Negative Impedance Multiplication-Division Operator is invariant with respect to the choice of the impedance-inversion ports.

Figure 35:
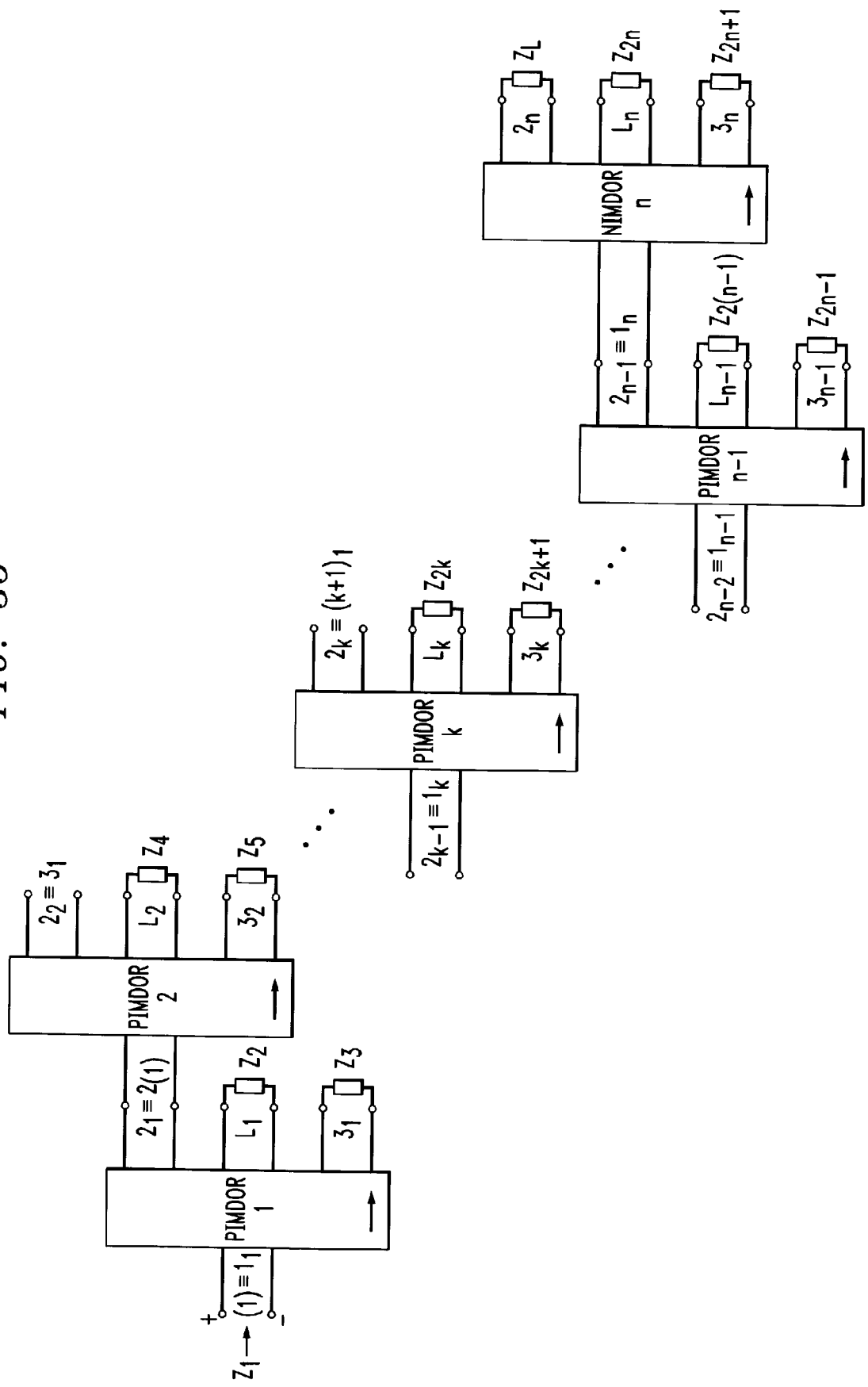

A Type II General Negative Impedance Multiplication-Division Operator also has the single NMDOR placed at the end of the cascade. The cascade connection representing a Type II General Negative Impedance Multiplication-Division Operator shown in FIG. 35 where each Positive Impedance Multiplication-Division Operator is terminated by a 2-terminal impedance at one of its impedance inversion ports, as well as at the distinguished port. Except for the last Positive Impedance Multiplication-Division Operator, the other impedance inversion port is used to cascade one Positive Impedance Multiplication-Division Operator to the next. The distinguished port is terminated by the Negative Impedance Multiplication-Division Operator for the last Positive Impedance Multiplication-Division Operator. Consider the k-th Positive Impedance Multiplication-Division Operator in FIG. 35, with k ranging over 1, 2, ..., n−2. As shown in FIG. 35, ports $L_k$ and $3_k$ are terminated with the 2-terminal impedances $Z_{2k}$ and $Z_{2k+1}$, respectively, while port $2_k$ is terminated with the (k+1)-th Positive Impedance Multiplication-Division Operator for k=1, 2, ..., n−3; port $2_k$ is terminated with the single Negative Impedance Multiplication-Division Operator for the (n−1)-th Positive Impedance Multiplication-Division Operator. Finally, the Negative Impedance Multiplication-Division Operator itself is terminated with loads $Z_L$, $Z_{2n}$, and $Z_{2n+1}$ at ports $2_n$, $L_n$, and $3_n$ respectively.

The value of $Z_{(1)}$ for the Type II General Negative Impedance Multiplication-Division Operator of FIG. 35 is determined by induction as before. First consider the case of the n-th place Negative Impedance Multiplication-Division Operator terminated with loads $Z_L$, $Z_{2n}$, and $Z_{2n+1}$ at ports $2_n$, $L_n$, and $3_n$, respectively. By definition, the (n−1)-th Positive Impedance Multiplication-Division Operator, terminated with the loads $Z_{2(n-1)}$ and $Z_{2n-1}$ at ports $L_{n-1}$ and $3_{n-1}$, respectively, is also effectively terminated with the load $$-(Z_L^{-1} Z_{2n} Z_{2n+1}^{-1})$$

at port $2_{n-1}$. Hence, the impedance seen at port $1_{n-1}$ is $$-(Z_L^{-1} Z_{2n} Z_{2n+1}^{-1})^{-1} Z_{2(n-1)} Z_{2n-1}^{-1}.$$

Continuing in this manner, and keeping track of the exponent inversion at each stage, it is evident that the impedance offered by the loaded k-th Positive Impedance Multiplication-Division Operator at port $1_k$ of the Type II General Negative Impedance Multiplication-Division Operator in FIG. 35 is $Z_{2k} \times$(impedance seen at port $1_{k+1}$ of the loaded $$(k+1)\text{-th Positive Impedance Multiplication-Division Operator})^{(-1)} \times Z_{2k+1}^{-1}.$$

Specifically, for k=1, the impedance seen at the input or port (1) of the Type II General Negative Impedance Multiplication-Division Operator is:

$$Z_{(1)} = -Z_L^{(-1)^{(n-1)}} \times \prod_{i=2}^{n-1} (Z_{2i} Z_{2i+1}^{-1})^{(-1)^{(i-1)}} \tag{18}$$

For example, for n=5, i.e., implementations consisting of four Positive Impedance Multiplication-Division Operators with one Negative Impedance Multiplication-Division Operator in cascade as above, the input impedance seen at Type I and Type II General Negative Impedance Multiplication-Division Operators are, respectively, as:

Type I: $Z_{(1)} = -Z_L \times Z_2^{-1} Z_3^{-1} Z_4^{-1} Z_5^{-1} Z_6^{-1} Z_7^{-1} Z_8^{-1} Z_9^{-1} Z_{10}^{-1} Z_{11}^{-1}$ (19)

Type II: $Z_{(1)} = -Z_L \times Z_2 Z_3^{-1} Z_4^{31} {}^1 Z_5 Z_6 Z_7^{-1} Z_8^{-1} Z_9 Z_{10} Z_{11}^{-1}$ (20)

Observe the pattern in the inversion of exponents for the Type General Negative Impedance Multiplication-Division Operator. Except for the adjustment of appropriate indices, the input impedance seen at a Type II General Negative Impedance Multiplication-Division Operator is invariant with respect to the choice of the impedance-inversion ports.

Figure 36:
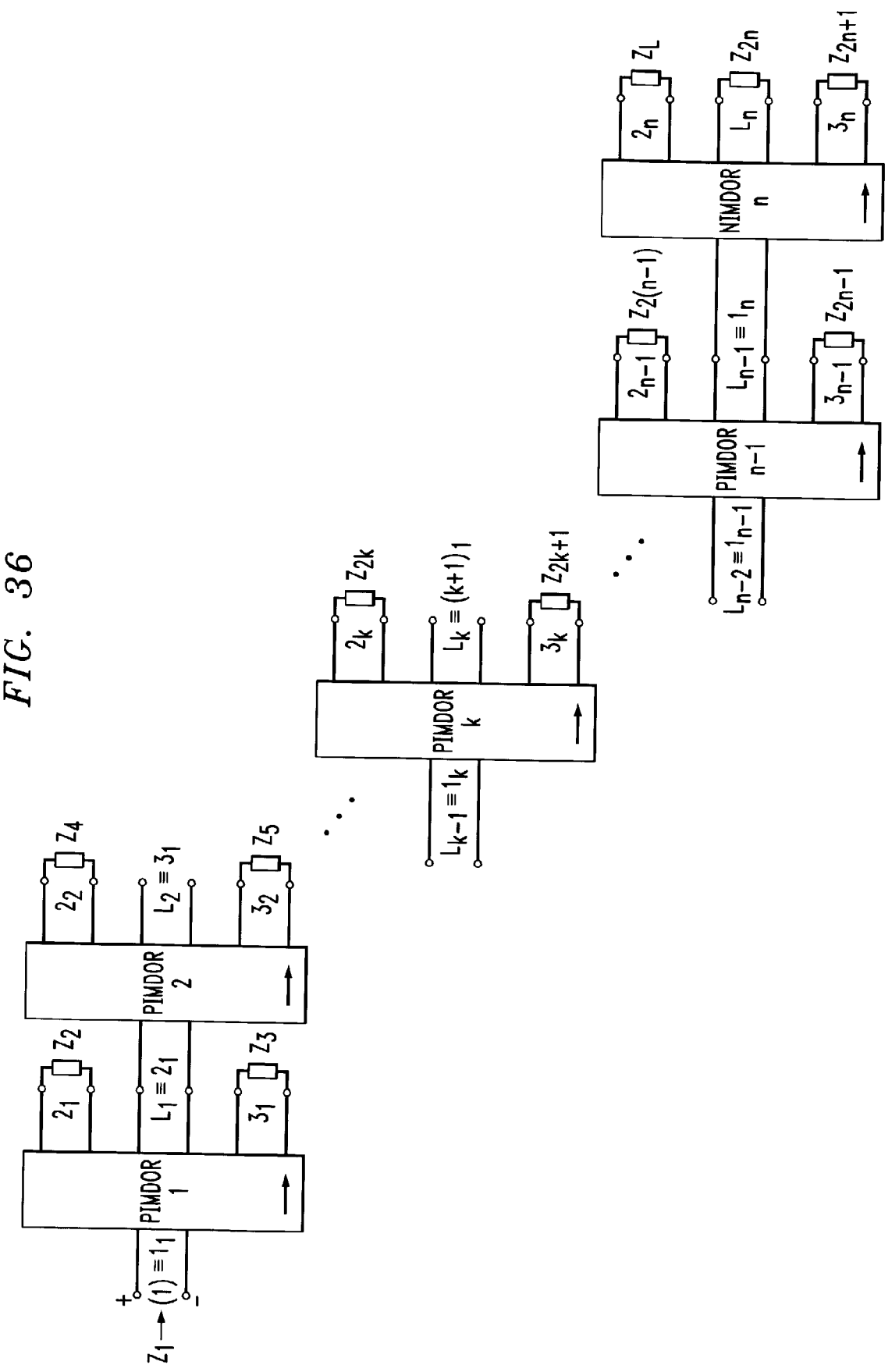
Figure 37:
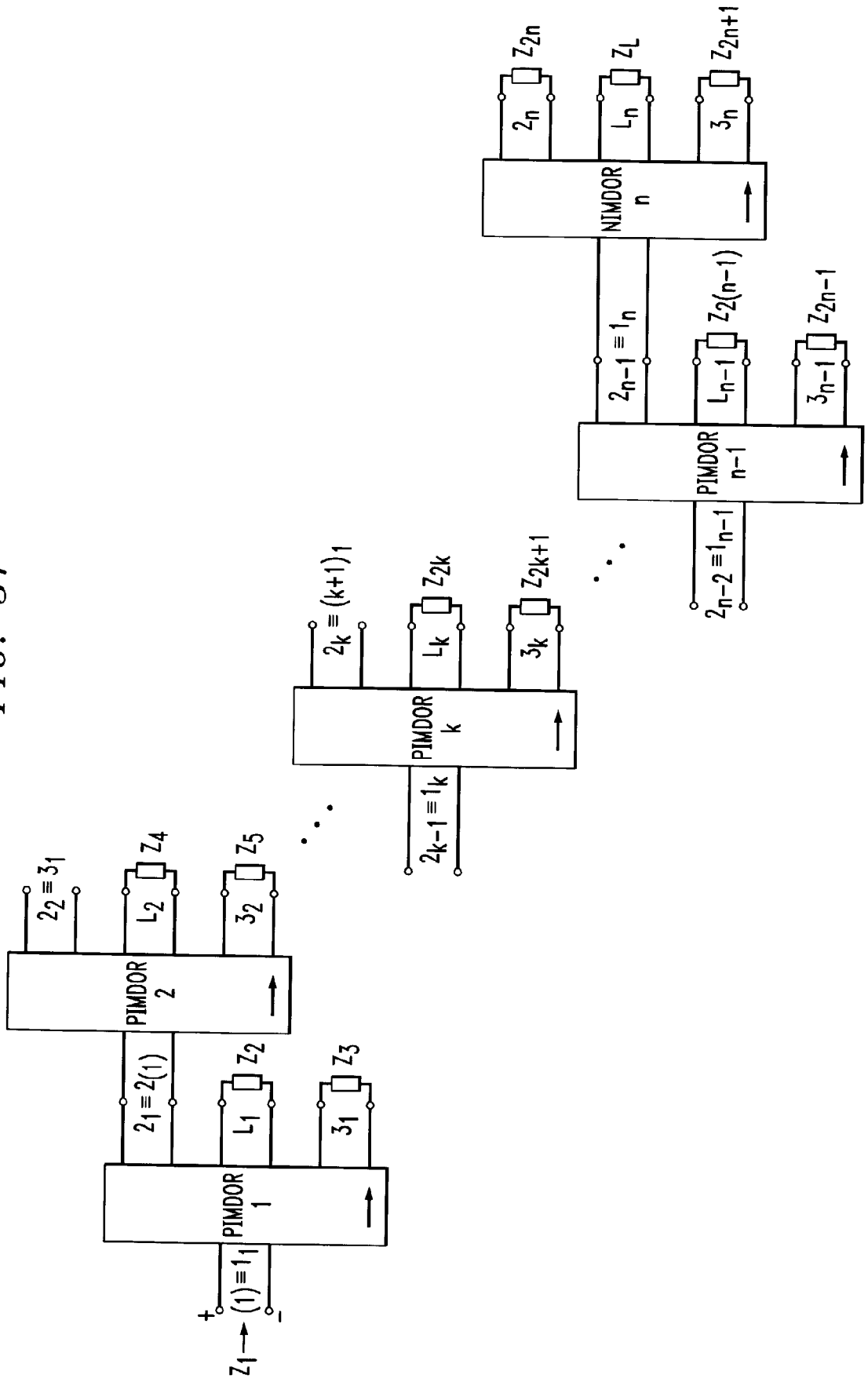

A Type III General Negative Impedance Multiplication-Division Operator, as shown in FIG. 36, is derived from FIG. 34 by replacing the Negative Impedance Multiplication-Division Operator terminations with those of FIG. 35. Likewise, a Type IV General Negative Impedance Multiplication-Division Operator, as shown in FIG. 37, is derived from FIG. 35 by replacing the Negative Impedance Multiplication-Division Operator terminations with those of FIG. 34. The driving-point impedance functions are easy to obtain and are not presented here.

There are additional alternatives as well. Observe that the General Negative Impedance Multiplication-Division Operator cascades of FIGS. 34 through 37 could have been constructed with an odd number of Negative Impedance Multiplication-Division Operators and the rest as Positive Impedance Multiplication-Division Operators. As long as we have an odd number of Negative Impedance Multiplication-Division Operators in cascade, the sign of the overall product seen at the input of the General Negative Impedance Multiplication-Division Operator will always be negative. Indeed, the odd number of Negative Impedance Multiplication-Division Operators may be interspersed with Positive Impedance Multiplication-Division Operators anywhere in the cascade preserving the desired sign-inverted impedance multiplication and division property of the General Negative Impedance Multiplication-Division Operator—the effect is permutation invariant with respect to the placement of the elements themselves. Each Positive Impedance Multiplication-Division Operator and Negative Impedance Multiplication-Division Operator in this chain allows two distinct alternatives for load terminations as considered earlier in FIGS. 34 through 37. The number of non-trivial distinct alternative realizations, each with multiple transistor-resistor realizations of their own, is large, and is not discussed further.

Sign-Inverted Reciprocal of the Product of an Arbitrary Finite Number of Impedance Functions Equation (17) immediately reveals that by setting $Z_L=1\Omega$, we obtain the pure reciprocal of the product of an arbitrary finite number of impedance functions. The driving point impedance function for this specialized Type I General Negative Impedance Multiplication-Division Operator is:

$$Z_{(1)}(s) = -\frac{1}{\prod_{i=2}^{2n+1} Z_i(s)}. \tag{21}$$

This version of the Type I General Negative Impedance Multiplication-Division Operator and the associated implementation obtained from FIG. 34 may be considered as a new circuit element.

With some careful manipulation of indices, all the other possible "types" of General Negative Impedance Multiplication-Division Operators characterized, for example by Equation (18) and its likes, can be used to obtain the above form of the driving-point impedance.

Summary

The various embodiments of the Impedance Multiplication-Division Operator comprise non-reciprocal network elements, each of which produces an input impedance that is related to the multiplication-division of its load impedances.

What is claimed is:

1. A non-reciprocal 2(n+1)-port network element for presenting a determinable impedance at an input port, comprising:
   a 2-terminal input port;
   (2n+1) 2-terminal load ports, where n is a positive integer greater than or equal to 1, each of said (2n+1) 2-terminal load ports terminating a 2-terminal impedance load element; and
   impedance converter means for presenting an impedance on said 2-terminal input port that comprises a multiplication-division of the impedances of said 2-terminal load elements terminated at said (2n+1) 2-terminal load ports.

2. The non-reciprocal multi-port network element of claim 1, wherein n=1, said impedance converter means comprises:
   positive impedance operator means for generating voltage- and current-variables at said 2-terminal input port and said (2n+1) 2-terminal load ports, said voltage- and current-variables comprising:

$$\begin{bmatrix} V_1 \\ V_2 \\ I_3 \\ V_4 \end{bmatrix} = \begin{bmatrix} 0 & -1 & 0 & 0 \\ 0 & 0 & 1 & 0 \\ 0 & 0 & 0 & -1 \\ 1 & 0 & 0 & 0 \end{bmatrix} \begin{bmatrix} I_1 \\ I_2 \\ V_3 \\ I_4 \end{bmatrix},$$

where $V_j$ and $I_j$ denote the voltage- and current-variables at the j th port, j=1, 2, 3, 4, respectively.

3. The non-reciprocal multi-port network element of claim 1, wherein n=1, said impedance converter means comprises:
   negative impedance operator means for generating voltage- and current-variables at said 2-terminal input port and said (2n+1) 2-terminal load ports, said voltage- and current-variables comprising:

$$\begin{bmatrix} V_1 \\ V_2 \\ I_3 \\ V_4 \end{bmatrix} = \begin{bmatrix} 0 & 1 & 0 & 0 \\ 0 & 0 & 1 & 0 \\ 0 & 0 & 0 & -1 \\ 1 & 0 & 0 & 0 \end{bmatrix} \begin{bmatrix} I_1 \\ I_2 \\ V_3 \\ I_4 \end{bmatrix},$$

where $V_j$ and $I_j$ denote the voltage- and current-variables at the j th port, j=1, 2, 3, 4, respectively.

4. The non-reciprocal multi-port network element of claim 1, wherein said impedance converter means comprises:
   general positive impedance operator means for generating an impedance at said 2-terminal input port of $$Z_{(1)} = Z_L \prod_{k=2}^{2n+1} Z_k^{-1}$$

where $Z_k$ comprises a 2-terminal impedance load element terminating the k th port, and $Z_L$ comprises a 2-terminal impedance load element terminating the k=1 port.

5. The non-reciprocal multi-port network element of claim 4, wherein said general positive impedance operator means comprises:
   (n) positive impedance operator means, each having a 2-terminal input port and (3) 2-terminal load ports, for generating voltage- and current-variables at said impedance module means 2-terminal input port comprising:

$$\begin{bmatrix} V_1 \\ V_2 \\ I_3 \\ V_4 \end{bmatrix} = \begin{bmatrix} 0 & -1 & 0 & 0 \\ 0 & 0 & 1 & 0 \\ 0 & 0 & 0 & -1 \\ 1 & 0 & 0 & 0 \end{bmatrix} \begin{bmatrix} I_1 \\ I_2 \\ V_3 \\ I_4 \end{bmatrix},$$

where $V_j$ and $I_j$ denote the voltage- and current-variables at the j th port, j=1, 2, 3, 4, respectively;
   means for interconnecting said (n) positive impedance operator means in a series of n interconnected elements, wherein:
   said positive impedance operator means input terminal of a first of said (n) interconnected positive impedance operator means comprises said 2-terminal input port,
   a one of said (3) 2-terminal load ports of a last of said (n) interconnected positive impedance operator means comprises said (2n+1)th port,
   said positive impedance operator means input terminal of each remaining one of said (n) interconnected positive impedance operator means is connected to a one of said (3) 2-terminal load ports of a prior one in said series of said (n) interconnected positive impedance operator means, and
   each remaining one of said of said (3) 2-terminal load ports of said (n) interconnected positive impedance operator means is connected to an impedance.

6. The non-reciprocal multi-port network element of claim 1, wherein said impedance converter means comprises:

general negative impedance operator means for generating an impedance at said 2-terminal input port of $$Z_{(1)} = Z_L \prod_i Z_i \times \prod_j Z_j^{-1}$$

where $Z_L$ comprises a 2-terminal impedance load element terminating the first port, $Z_j$ comprises a 2-terminal impedance load element terminating a selected one of said (2n+1) ports where $1 \leq j \leq m$ where m is an even integer, $Z_j$ comprises a 2-terminal impedance load element terminating a selected one of said (2n+1) ports where $1 \leq i \leq p$ where $p=(2n-m)$.

7. The non-reciprocal multi-port network element of claim 6, wherein said general negative impedance operator means comprises:

(m) positive impedance operator means, each having a 2-terminal input port and (3) 2-terminal load ports, for generating voltage- and current-variables at said impedance module means 2-terminal input port comprising:

$$\begin{bmatrix} V_1 \\ V_2 \\ I_3 \\ V_4 \end{bmatrix} = \begin{bmatrix} 0 & -1 & 0 & 0 \\ 0 & 0 & 1 & 0 \\ 0 & 0 & 0 & -1 \\ 1 & 0 & 0 & 0 \end{bmatrix} \begin{bmatrix} I_1 \\ I_2 \\ V_3 \\ I_4 \end{bmatrix},$$

where $V_j$ and $I_j$ denote the voltage- and current-variables at the j th port, j=1, 2, 3, 4, respectively;

(2n−m) negative impedance operator means, each having a 2-terminal input port and (3) 2-terminal load ports, for generating voltage- and current-variables at said impedance module means 2-terminal input port comprising:

$$\begin{bmatrix} V_1 \\ V_2 \\ I_3 \\ V_4 \end{bmatrix} = \begin{bmatrix} 0 & 1 & 0 & 0 \\ 0 & 0 & 1 & 0 \\ 0 & 0 & 0 & -1 \\ 1 & 0 & 0 & 0 \end{bmatrix} \begin{bmatrix} I_1 \\ I_2 \\ V_3 \\ I_4 \end{bmatrix},$$

means for interconnecting said (m) positive impedance operator means and said (2n−m) negative impedance operator means in a series of n interconnected elements, wherein:

said impedance module means input terminal of a first of said (n) interconnected impedance module means comprises said 2-terminal input port, a one of said (3) 2-terminal load ports of a last of said (n) interconnected impedance module means comprises said (2n+1)th port, said impedance module means input terminal of each remaining one of said (n) interconnected impedance module means is connected to a one of said (3) 2-terminal load ports of a prior one in said series of said (n) interconnected impedance module means, and each remaining one of said of said (3) 2-terminal load ports of said (n) interconnected impedance module means is connected to an impedance.

8. A method of presenting a determinable impedance at an input port of a non-reciprocal 2(n+1)-port network element that comprises a 2-terminal input port and (2n+1) 2-terminal load ports, where n is a positive integer greater than or equal to 1, said method comprising:

terminating each of said (2n+1) 2-terminal load ports with a 2-terminal impedance load element; and operating an impedance converter for presenting an impedance on said 2-terminal input port that comprises a multiplication-division of the impedances of said 2-terminal load elements terminated at said (2n+1) 2-terminal load ports.

9. The method of presenting a determinable impedance at an input port of a non-reciprocal 2(n+1)-port network element of claim 8, wherein n=1, said step of operating an impedance converter composes:

generating a positive impedance having voltage- and current-variables at said 2-terminal input port and said (2n+1) 2-terminal load ports comprising:

$$\begin{bmatrix} V_1 \\ V_2 \\ I_3 \\ V_4 \end{bmatrix} = \begin{bmatrix} 0 & -1 & 0 & 0 \\ 0 & 0 & 1 & 0 \\ 0 & 0 & 0 & -1 \\ 1 & 0 & 0 & 0 \end{bmatrix} \begin{bmatrix} I_1 \\ I_2 \\ V_3 \\ I_4 \end{bmatrix},$$

where $V_j$ and $I_j$ denote the voltage- and current-variables at the j th port, j=1, 2, 3, 4, respectively.

10. The method of presenting a determinable impedance at an input port of a non-reciprocal 2(n+1)-port network element of claim 8, wherein n=1, said operating an impedance converter comprises:

generating a negative impedance having voltage- and current-variables at said 2-terminal input port and said (2n+1) 2-terminal load ports comprising:

$$\begin{bmatrix} V_1 \\ V_2 \\ I_3 \\ V_4 \end{bmatrix} = \begin{bmatrix} 0 & 1 & 0 & 0 \\ 0 & 0 & 1 & 0 \\ 0 & 0 & 0 & -1 \\ 1 & 0 & 0 & 0 \end{bmatrix} \begin{bmatrix} I_1 \\ I_2 \\ V_3 \\ I_4 \end{bmatrix},$$

where $V_j$ and $I_j$ denote the voltage- and current-variables at the j th port, j=1, 2, 3, 4, respectively.

11. The method of presenting a determinable impedance at an input port of a non-reciprocal 2(n+1)-port network element of claim 8, wherein said step of operating an impedance converter comprises:

generating a general positive impedance at said 2-terminal input port of $$Z_{(1)} = Z_L \prod_{k=2}^{2n+1} Z_k^{-1}$$

where $Z_k$ comprises a 2-terminal impedance load element terminating the k th port, and $Z_L$ comprises a 2-terminal impedance load element terminating the k=1 port.

12. The method of presenting a determinable impedance at an input port of a non-reciprocal 2(n+1)-port network element of claim 11, wherein said step of generating a general positive impedance comprises:

generating (n) positive impedances, each having a 2-terminal input port and (3) 2-terminal load ports, for generating voltage- and current-variables at said positive impedance 2-terminal input port comprising:

$$\begin{bmatrix} V_1 \\ V_2 \\ I_3 \\ V_4 \end{bmatrix} = \begin{bmatrix} 0 & -1 & 0 & 0 \\ 0 & 0 & 1 & 0 \\ 0 & 0 & 0 & -1 \\ 1 & 0 & 0 & 0 \end{bmatrix} \begin{bmatrix} I_1 \\ I_2 \\ V_3 \\ I_4 \end{bmatrix},$$

where $V_j$ and $I_j$ denote the voltage- and current-variables at the j th port, j=1, 2, 3, 4, respectively;

interconnecting said (n) positive impedances in a series of n interconnected elements, wherein:

said positive impedance input terminal of a first of said (n) interconnected positive impedances comprises said 2-terminal input port, a one of said (3) 2-terminal load ports of a last of said (n) interconnected positive impedances comprises said (2n+1)th port, said positive impedance input terminal of each remaining one of said (n) interconnected positive impedances is connected to a one of said (3) 2-terminal load ports of a prior one in said series of said (n) interconnected positive impedances, and each remaining one of said of said (3) 2-terminal load ports of said (n) interconnected positive impedances is connected to said 2-terminal impedance load element.

13. The method of presenting a determinable impedance at an input port of a non-reciprocal 2(n+1)-port network element of claim 8, wherein said step of operating an impedance converter comprises:

generating a general negative impedance at said 2-terminal input port of $$Z_{(1)} = Z_L \prod_i Z_i \times \prod_j Z_j^{-1}$$

where $Z_L$ comprises a 2-terminal impedance load element terminating the first port, $Z_j$ comprises a 2-terminal impedance load element terminating a selected one of said (2n+1) ports where $1 \leq j \leq m$ where m is an even integer, $Z_i$ comprises a 2-terminal impedance load element terminating a selected one of said (2n+1) ports where $1 \leq i \leq p$ where p=(2n−m).

14. The method of presenting a determinable impedance at an input port of a non-reciprocal 2(n+1)-port network element of claim 13, wherein said general negative impedance operator means comprises:

generating (m) positive impedances, each having a 2-terminal input port and (3) 2-terminal load ports, for generating voltage- and current-variables at said positive impedance 2-terminal input port comprising:

$$\begin{bmatrix} V_1 \\ V_2 \\ I_3 \\ V_4 \end{bmatrix} = \begin{bmatrix} 0 & -1 & 0 & 0 \\ 0 & 0 & 1 & 0 \\ 0 & 0 & 0 & -1 \\ 1 & 0 & 0 & 0 \end{bmatrix} \begin{bmatrix} I_1 \\ I_2 \\ V_3 \\ I_4 \end{bmatrix},$$

where $V_j$ and $I_j$ denote the voltage- and current-variables at the j th port, j=1, 2, 3, 4, respectively;

generating (2n−m) negative impedances, each having a 2-terminal input port and (3) 2-terminal load ports, for generating voltage- and current-variables at said negative impedance 2-terminal input port comprising:

$$\begin{bmatrix} V_1 \\ V_2 \\ I_3 \\ V_4 \end{bmatrix} = \begin{bmatrix} 0 & 1 & 0 & 0 \\ 0 & 0 & 1 & 0 \\ 0 & 0 & 0 & -1 \\ 1 & 0 & 0 & 0 \end{bmatrix} \begin{bmatrix} I_1 \\ I_2 \\ V_3 \\ I_4 \end{bmatrix},$$

interconnecting said (m) positive impedances and said (2n−m) negative impedances in a series of n interconnected elements, wherein:

said impedance input terminal of a first of said (n) interconnected impedances comprises said 2-terminal input port, a one of said (3) 2-terminal load ports of a last of said (n) interconnected impedances comprises said (2n+1)th port, said impedance input terminal of each remaining one of said (n) interconnected impedances is connected to a one of said (3) 2-terminal load ports of a prior one in said series of said (n) interconnected impedances, and each remaining one of said of said (3) 2-terminal load ports of said (n) interconnected impedances is connected to said 2-terminal impedance load element.

* * * * *